(12) United States Patent
Kurosawa et al.

(10) Patent No.: US 6,201,306 B1
(45) Date of Patent: *Mar. 13, 2001

(54) PUSH-UP PIN OF A SEMICONDUCTOR ELEMENT PUSHING-UP DEVICE, AND A METHOD FOR SEPARATING

(75) Inventors: Tetsuya Kurosawa, Yokohama; Shigeo Sasaki, Chigasaki, both of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/760,117

(22) Filed: Dec. 3, 1996

(30) Foreign Application Priority Data

Dec. 5, 1995 (JP) .................................................. 7-316403

(51) Int. Cl.⁷ ..................................................... H01L 23/48
(52) U.S. Cl. .......................... 257/783; 257/785; 228/6.2; 228/8; 228/102; 228/180.2
(58) Field of Search .................................. 228/6.2, 8, 2.3, 228/102, 180.21; 438/118, 464, 119; 29/840; 156/64, 344, 584, 361; 257/782, 783, 785

(56) References Cited

U.S. PATENT DOCUMENTS

| | | | |
|---|---|---|---|
| 4,667,402 | * 5/1987 | Wilde | 29/840 |
| 4,859,269 | * 8/1989 | Nishiguchi | 156/361 |
| 4,874,444 | * 10/1989 | Satou et al. | 156/64 |
| 4,990,051 | * 2/1991 | Safabakhsh et al. | 414/786 |
| 5,169,196 | * 12/1992 | Safabakhsh | 294/64.3 |
| 5,351,872 | * 10/1994 | Kobayashi | 228/6.2 |
| 5,447,266 | * 9/1995 | Misono | 228/102 |
| 5,589,029 | * 12/1996 | Matsui et al. | 156/344 |

FOREIGN PATENT DOCUMENTS

| | | |
|---|---|---|
| 62-128139 | * 6/1987 | (JP) . |
| 62-166536 | * 7/1987 | (JP) . |
| 62-210635 | * 9/1987 | (JP) . |
| 2-66957 | * 3/1990 | (JP) . |
| 5-193085 | * 5/1993 | (JP) . |

* cited by examiner

Primary Examiner—Olik Chaudhuri
Assistant Examiner—Alonzo Chambliss
(74) Attorney, Agent, or Firm—Finnegan, Henderson, Farabow, Garrett, & Dunner, L.L.P.

(57) ABSTRACT

A push-up pin used for separating a semiconductor element attached by adhesive to an adhesive sheet of a semiconductor element pushing-up device in a die bonding apparatus from the adhesive sheet by pushing up the semiconductor element from the rear surface side of the adhesive sheet includes a tip end portion having a shape for applying pushing-up pressure with the thicknesses of the adhesive sheet and the adhesive kept constant when the pushing-up pressure for pushing up the semiconductor element from the rear surface side of the adhesive sheet is applied, and a base portion for supporting the tip end portion.

14 Claims, 23 Drawing Sheets

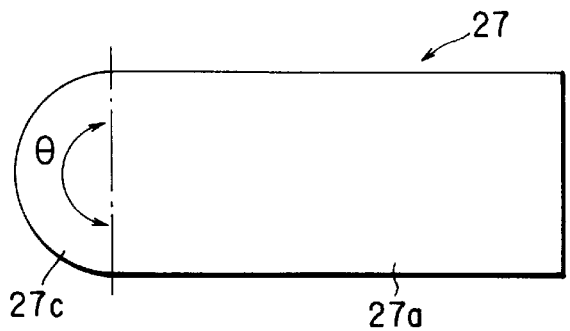
F I G. 9A
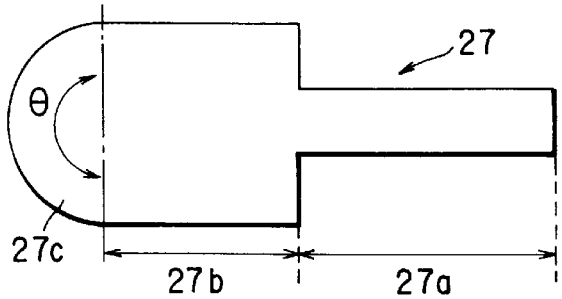
F I G. 9B
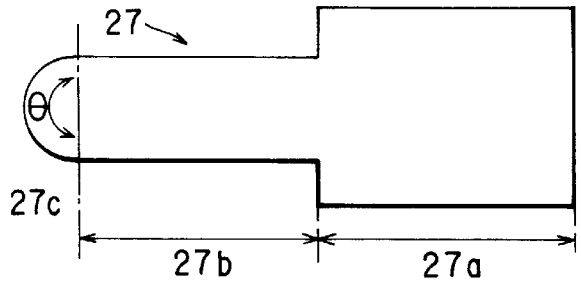
F I G. 9C
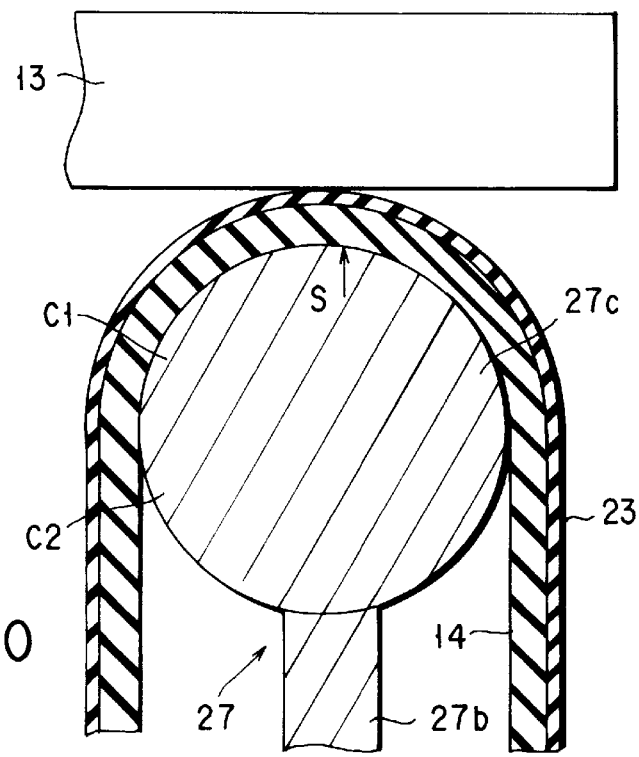
F I G. 10

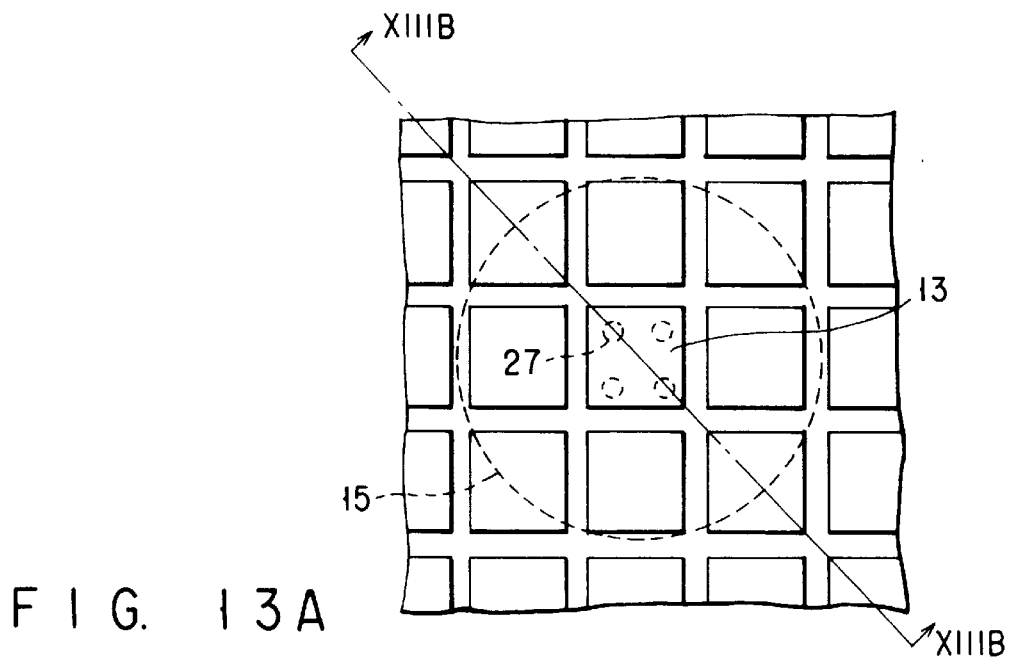
F I G. 13A
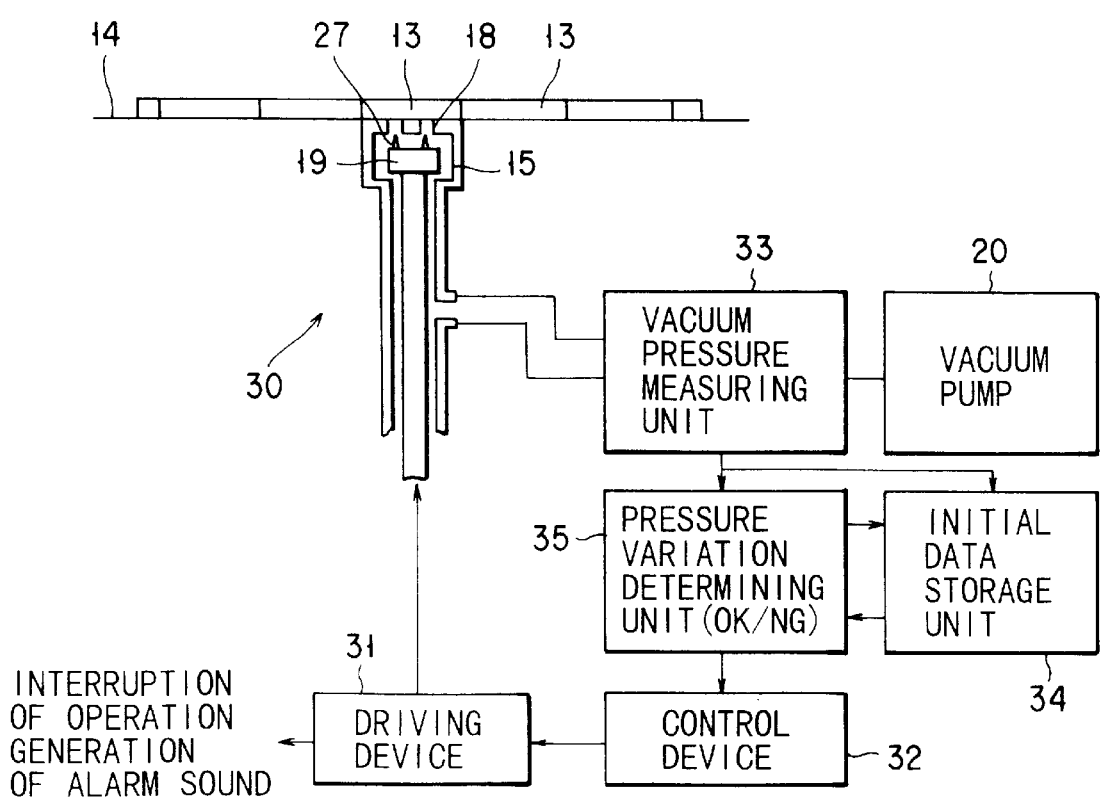
F I G. 13B

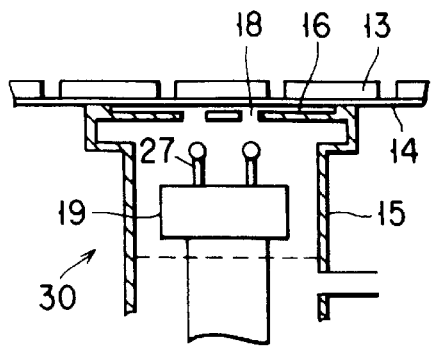
F I G. 14A
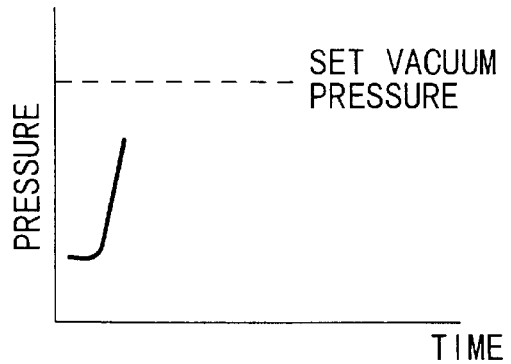
F I G. 14B
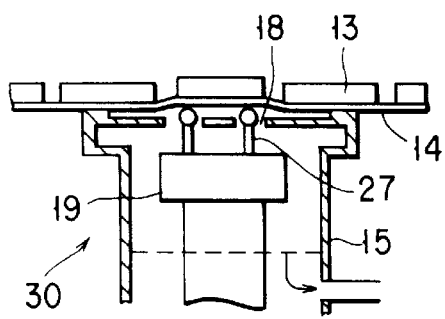
F I G. 14C
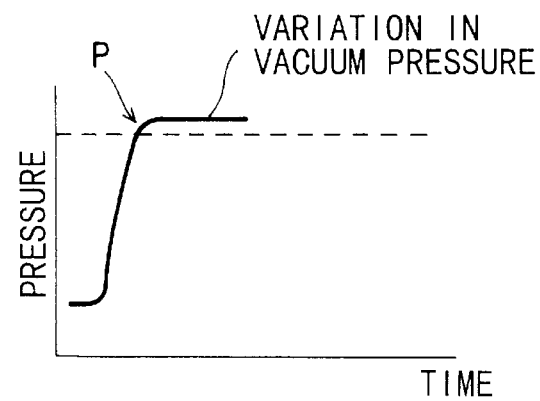
F I G. 14D
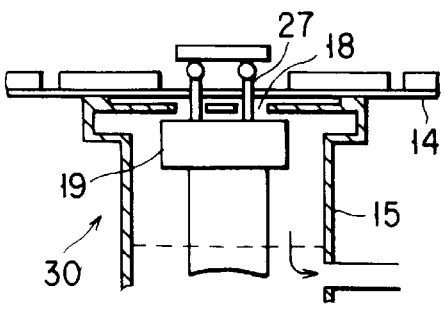
F I G. 14E
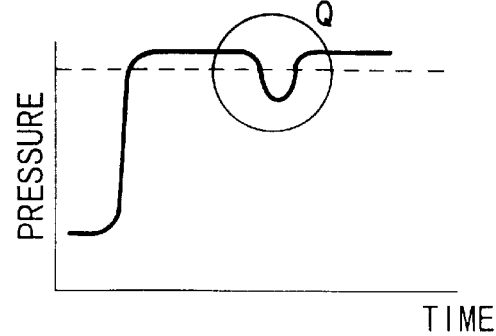
F I G. 14F

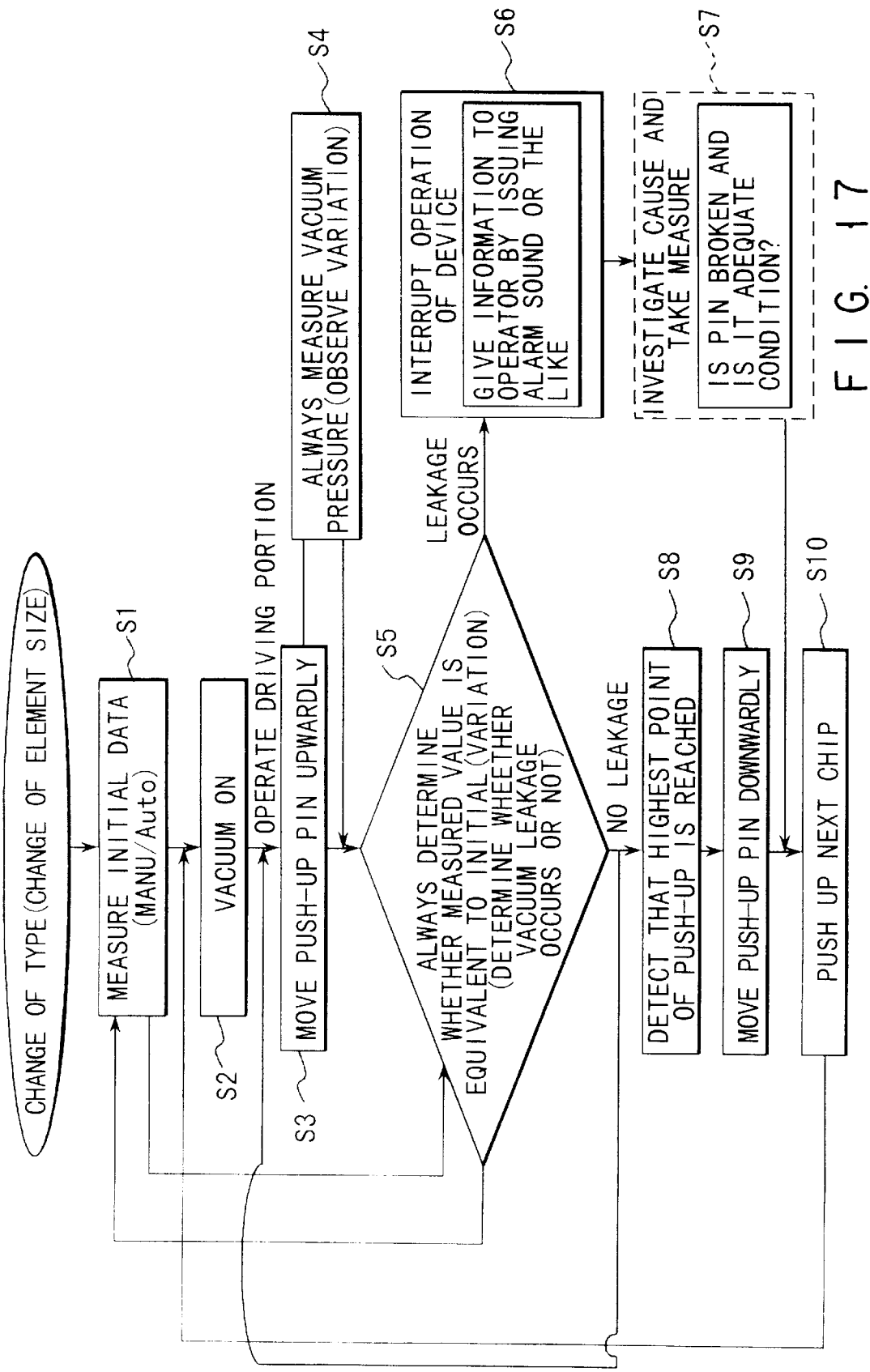
F I G. 17

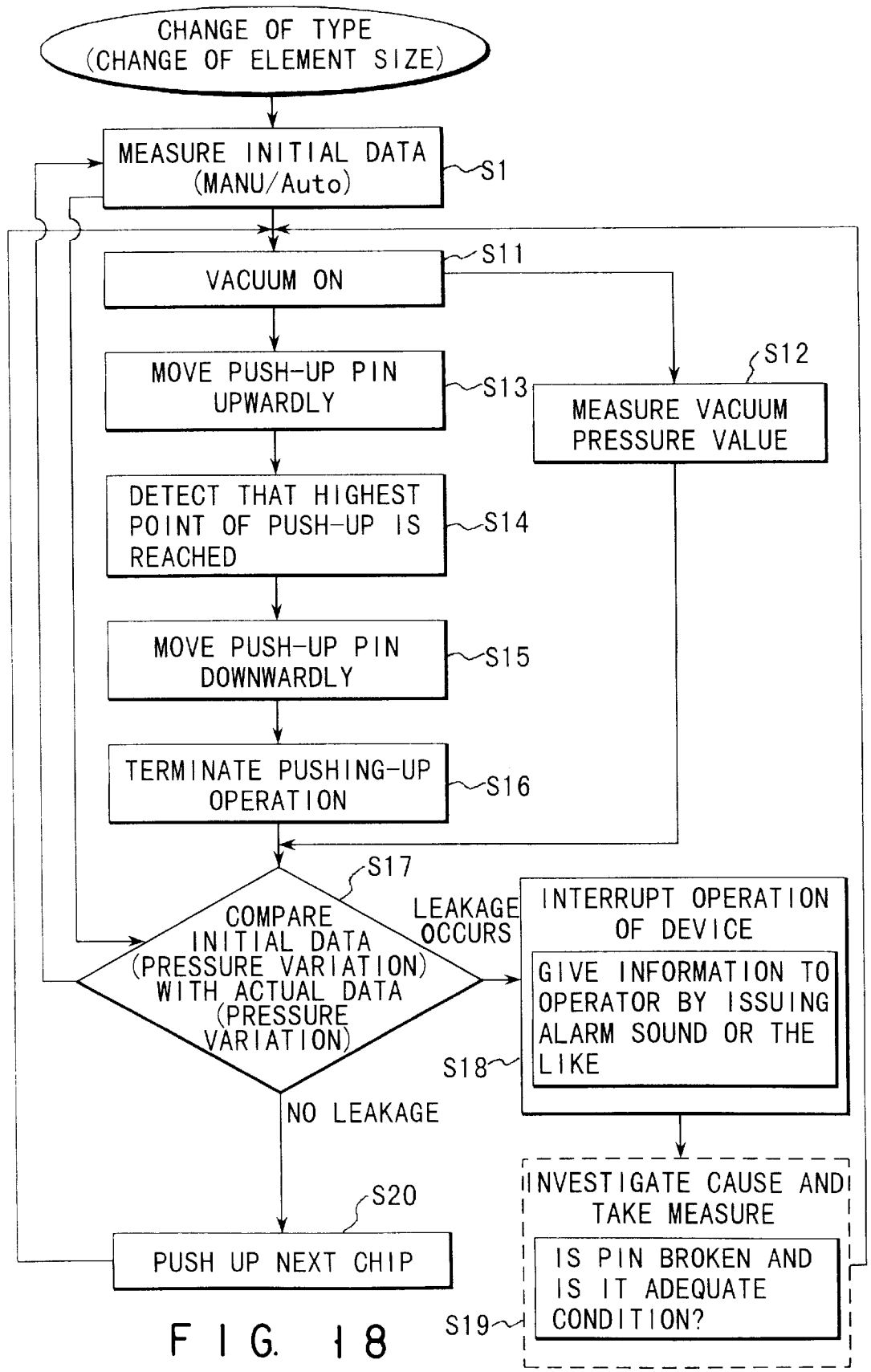
F I G. 18

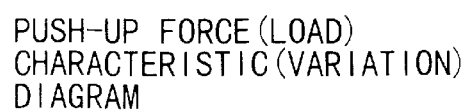
PUSH-UP FORCE (LOAD)
CHARACTERISTIC (VARIATION)
DIAGRAM
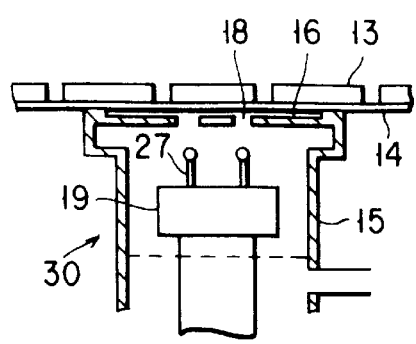
F I G. 22A
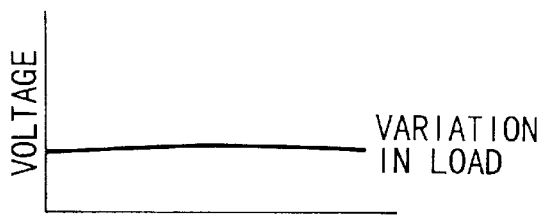
VARIATION IN LOAD
F I G. 22B
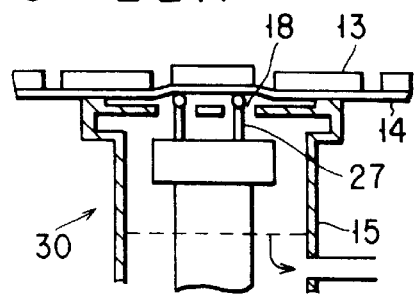
F I G. 22C
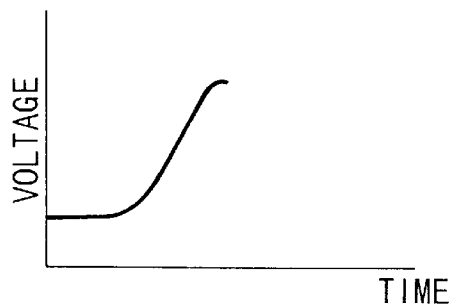
F I G. 22D
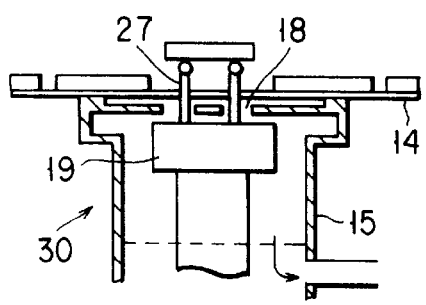
F I G. 22E
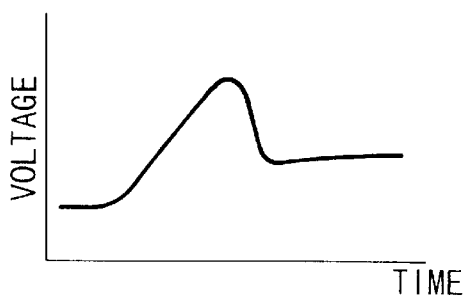
F I G. 22F
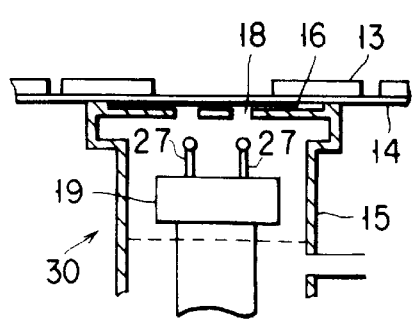
F I G. 22G
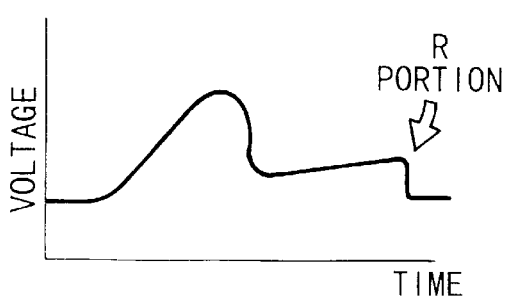
R PORTION
F I G. 22H

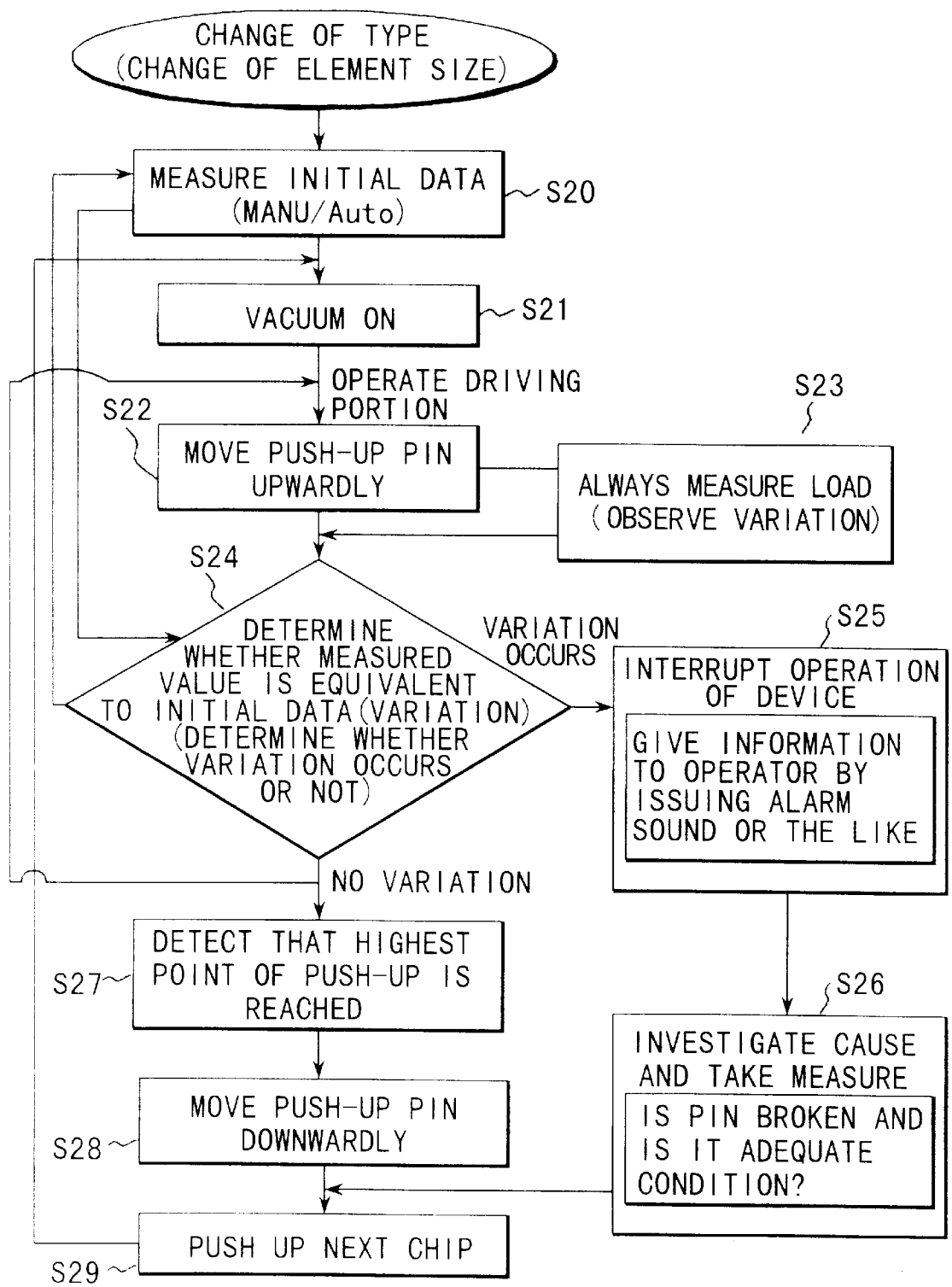
F I G. 24

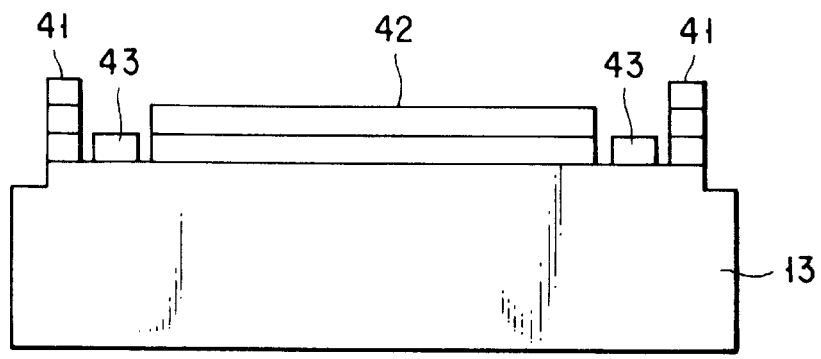
F I G. 28
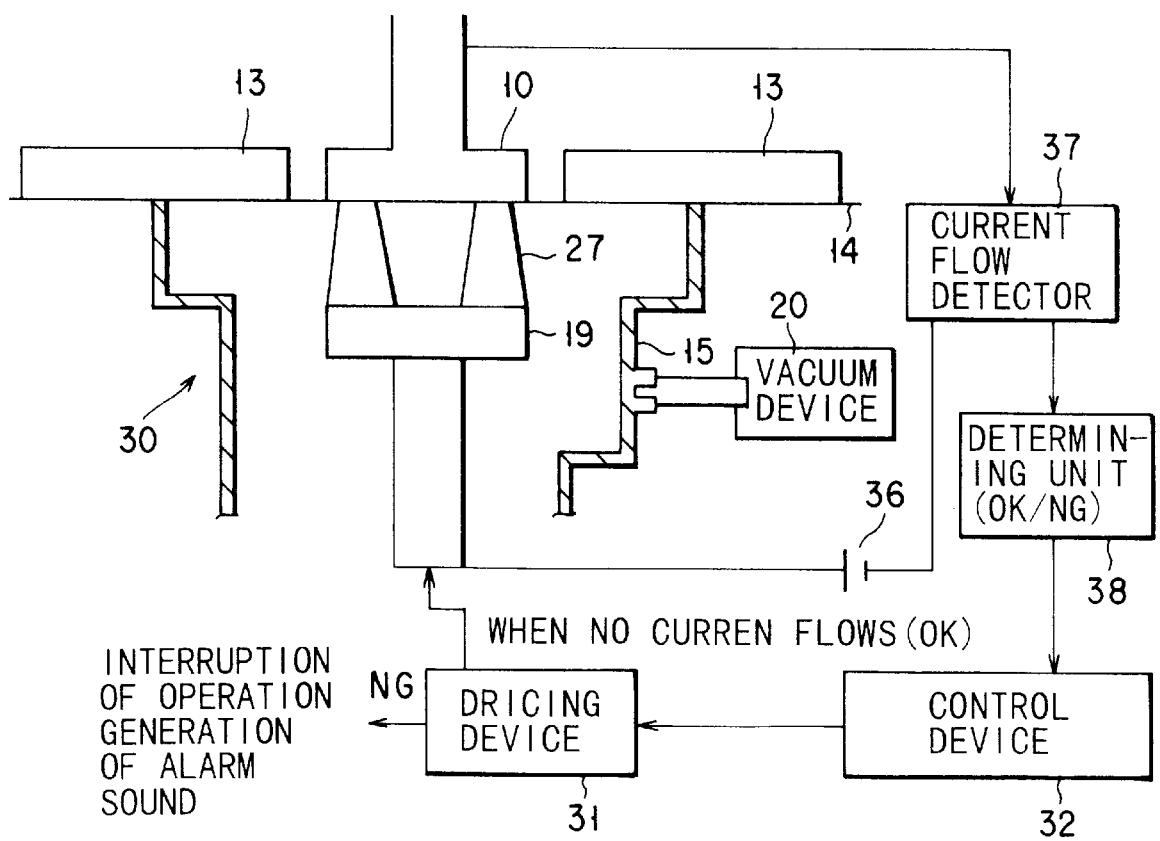
F I G. 29

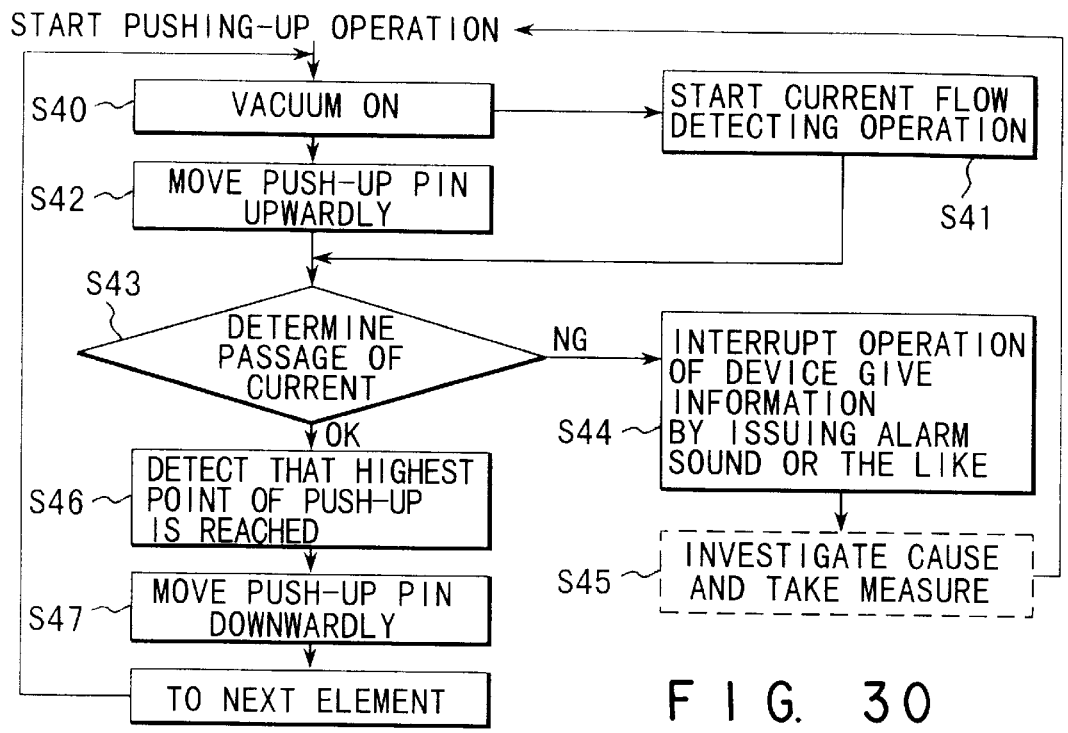
F I G. 30
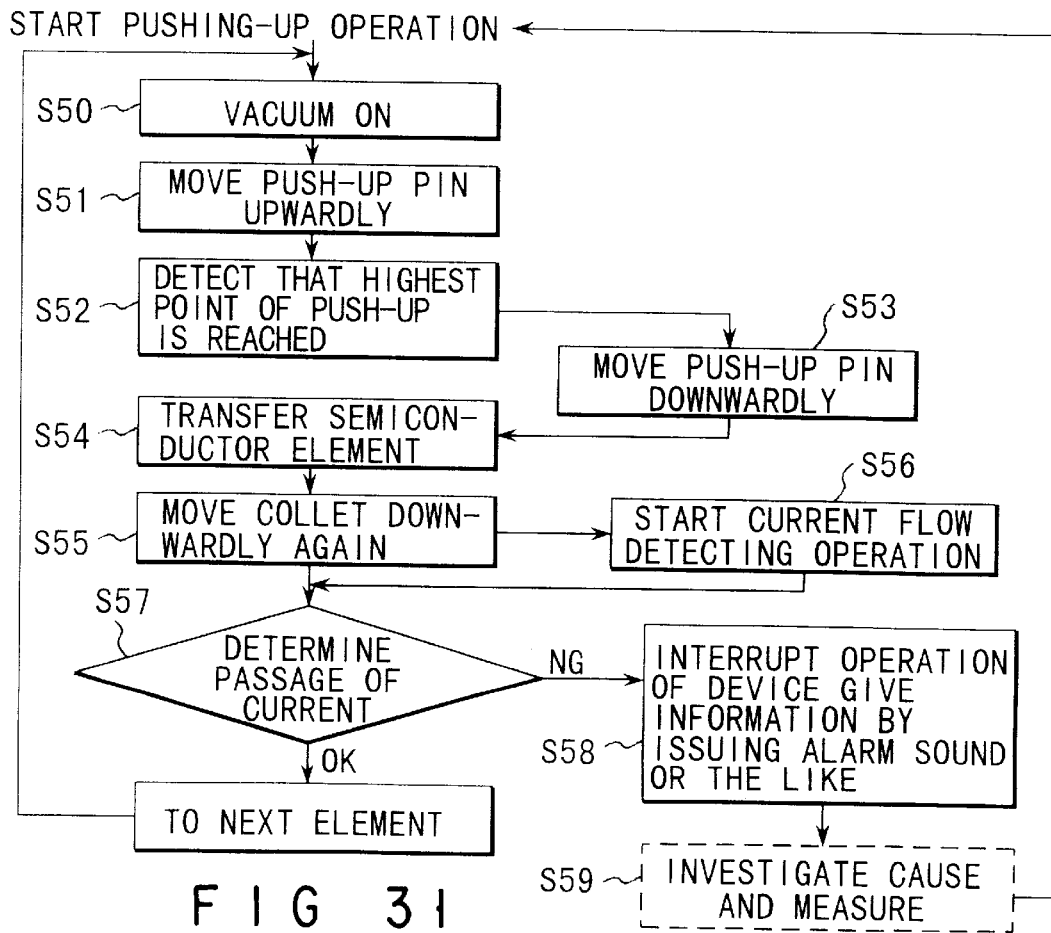
F I G 31

PUSH-UP PIN OF A SEMICONDUCTOR ELEMENT PUSHING-UP DEVICE, AND A METHOD FOR SEPARATING

BACKGROUND OF THE INVENTION

1. Field of the Invention

This invention relates to a push-up pin of a semiconductor element pushing-up device in a die bonding apparatus, a semiconductor element pushing-up device in a die bonding apparatus, and a method for separating a semiconductor element in a semiconductor element pushing-up device of a die bonding apparatus.

2. Description of the Related Art

The process for bonding a semiconductor element obtained by subjecting a semiconductor substrate to the dicing process on a lead frame in the method of manufacturing a semiconductor device is called a die bonding process.

The conventional die bonding apparatus is shown in FIG. 1.

The die bonding apparatus is mainly constructed by a portion for taking up one semiconductor element, a portion for moving the taken-up semiconductor element onto a lead frame, and a portion for carrying the lead frame.

The portion for taking up the semiconductor element includes a wafer ring 2 for fixing a semiconductor substrate 1 obtained after semiconductor elements are subjected to the dicing process with the semiconductor substrate attached to the adhesive sheet, an XY table 3 for carrying the wafer ring 2, a camera 4 set above the XY table 3, and a semiconductor element pushing-up device 30 disposed below the XY table and used for pushing up the semiconductor element from the rear surface side of the adhesive sheet by use of a pin or pins so as to separate the semiconductor element from the adhesive sheet.

The portion for moving the semiconductor element onto the lead frame 12 includes an element suction head 10 for taking up the semiconductor element separated from the adhesive sheet and moving the semiconductor element to a position correcting stage 11, and the position correcting stage 11 for correcting the position of the semiconductor element, and a bonding head portion 8 for holding the semiconductor element by use of a collet and carrying the semiconductor element from the position correcting stage 11 onto the lead frame.

The portion for carrying the lead frame includes a lead frame supplying portion 5 for supplying a lead frame, a lead frame carrying portion 6, a paste supplying portion 7 for supplying adhesive onto the lead frame, and a lead frame receiving portion 9.

The portion for taking up the semiconductor element is explained in more detail with reference to FIGS. 2A, 2B, and 3A to 3D.

FIG. 2A is an enlarged top plan view showing the semiconductor substrate 1 on the semiconductor element pushing-up device 30, and FIG. 2B shows a cross section taken along the line IIB—IIB of FIG. 2A and the construction of peripheral devices of the semiconductor element pushing-up device 30.

FIGS. 3A to 3D are cross sectional views for illustrating the operation of the semiconductor element pushing-up device 30.

The semiconductor element pushing-up device 30 includes a backup holder 15, push-up pins 17, pin holder 19, pin holder driving device 31, control device 32, and vacuum device 20.

The backup holder 15 is a vacuum chamber having through holes 18 formed in the upper surface thereof 16 and vacuum suction force is applied to an adhesive sheet 14 on the upper surface of the backup holder 15 by use of the vacuum device 20 connected to the vacuum chamber so as to fixedly hold the adhesive sheet 14 on the upper surface thereof.

Semiconductor elements 13 are attached to the adhesive sheet 14.

The pin holder 19 capable of receiving a plurality of push-up pins 17 is inserted into the vacuum chamber of the backup holder 15 and the pin holder 19 is driven in the vertical direction by the driving device 31 shown in FIG. 2B.

The control device 32 controls the operation of the driving device 31 to drive the pin holder 19 in the vertical direction.

As shown in FIGS. 3A to 3D, if the pin holder 19 is moved upwardly in the state shown in FIG. 3A, the push-up pins 17 pass through the through holes 18 formed in the upper surface of the backup holder 15 to push up the semiconductor element 13 on the adhesive sheet 14 (FIG. 3B).

Since the adhesive sheet 14 is fixedly held on the backup holder 15 by vacuum suction force, the semiconductor element 13 is separated from the adhesive sheet 14 and taken up by suction of the element suction head 10 (FIG. 3C).

After this, the pin holder 19 is moved downwardly and the vacuum suction is released.

Then, a new semiconductor element 13 is placed on the backup holder 15 with the adhesive sheet 14 disposed therebetween in such a position that it can be taken up by suction of the semiconductor element suction head 10 (FIG. 3D).

Generally, the bonding force between the semiconductor element 13 and the adhesive sheet 14 depends on the property of the adhesive of the adhesive sheet 14 and the area of the semiconductor element 13. However, in the above-described conventional element pushing-up device 30, the conditions of the shape of the tip end portion of the push-up pin 17, the traveling distance in the vertical direction, the moving speed, and the vacuum suction pressure are kept constant irrespective of the above factors.

Recently, the adhesive strength between the semiconductor element 13 and the adhesive sheet 14 increases with an increase in the area of the semiconductor element 13 and it becomes difficult to separate the semiconductor element 13 from the adhesive sheet 14 under the constant condition as in the conventional case.

Therefore, in order to separate the semiconductor element 13 from the adhesive sheet 14, it is necessary for the push-up pins 17 to push up the semiconductor element 13 with extremely large force. In this case, there occurs a problem that the adhesive strength between the adhesive and the rear surface of the semiconductor element 13 becomes larger than the adhesive strength between the adhesive and the adhesive sheet 14 by application of the above force, and adhesive is left behind on the rear surface of the semiconductor element 13 which is separated from the adhesive sheet 14 or the adhesive sheet 14 is broken and left behind on the rear surface of the semiconductor element 13.

The above phenomenon is explained more in detail below.

FIG. 4 is a side view showing the push-up pin 17 of the conventional element pushing-up device 30.

The push-up pin 17 has a cylindrical portion 17a to be engaged into the pin holder 19, a conical coupling portion 17b, and a tip end portion 17c having a curved surface with the radius R of curvature.

The angle θ of circumference of a sector formed by a curved surface portion of the tip end portion 17c on a cross section taken along a line passing the central axes of the above portions is less than 180°.

FIG. 5 is an enlarged view showing a state in which the push-up pin 17 pushes up the semiconductor element 13. The push-up pin 17 pushes up the semiconductor element 13 while expanding the adhesive sheet 14 and adhesive 23.

In FIG. 5, since the adhesive sheet 14 and adhesive 23 are disposed between the tip end portion 17c of the push-up pin 17 and the rear surface of the semiconductor element 13 in an A zone, the adhesive sheet 14 and adhesive 23 are difficult to expand. On the other hand, since the adhesive sheet 14 and adhesive 23 are not set in contact with the rear surface of the semiconductor element 13 in a B zone, they can easily expand in the B zone than in the A zone.

Thus, the adhesive sheet 14 and adhesive 23 cannot expand equally in the A zone and in the B zone.

As a result, as shown in FIG. 5, the adhesive sheet 14 and adhesive 23 become extremely thin particularly on the boundary line S between the tip end portion 17c and the conical coupling portion 17b. Therefore, the coupling strength between the adhesive 23 on the tip end portion 17c and the adhesive 23 on the conical coupling portion 17b or the coupling strength between the adhesive 23 and the adhesive sheet 14 is lowered on the boundary line S and the adhesive strength is lowered.

As a result, the adhesive 23 in the A zone is cut apart from the adhesive in the B zone on the boundary line S and attached to the rear surface of the semiconductor element 13 or the adhesive sheet 14 is broken and attached to the rear surface of the semiconductor element 13 via the adhesive 23.

If the semiconductor element having the adhesive or adhesive sheet 14 thus left behind on the rear surface thereof is received into a plastic package, a crack may be caused in the package by the thermal stress when it is mounted on a circuit board, thus making the device defective.

Particularly, in a package with a structure in which the rear surface of the semiconductor element is directly covered with sealing plastic as in the LOC (Lead On Chip) structure which is frequently used recently, cracks may easily occur.

Further, there occurs a problem that since the load applied to the push-up pin 17 is increased, the push-up pin 17 will break through the adhesive sheet 14.

If the push-up pin 17 breaks through the adhesive sheet 14, the tip end portion of the push-up pin 17 is brought into direct contact with the rear surface of the semiconductor element 13, but since large force is applied to the tip end portion of the push-up pin 17 as described before, damage such as crack, scratch or mark of the push-up pin 17 is formed on the rear surface of the semiconductor element 13.

If the semiconductor element 13 having the damage formed on the rear surface thereof is set into a plastic package, a crack may be caused in the semiconductor element 13 by the thermal stress when it is mounted on a circuit board, thus making the device defective.

Semiconductor elements 13 having the damage formed on the rear surface thereof and semiconductor elements 13 having no damage were set into respective plastic packages, then subjected to the soldering process by infrared heating and mounted on circuit boards, and the defective rates thereof were compared. The result of comparison was that no defective device was contained in 139 semiconductor elements having no damage on the rear surface thereof but ten devices were found defective in 550 semiconductor elements having the damage formed on the rear surface thereof.

Thus, the probability that the semiconductor elements having the damage formed on the rear surface thereof become defective is high.

Further, in the conventional element pushing-up device 30, the process is continuously effected even after the adhesive sheet 14 is broken. At this time, as indicated by broken lines in FIG. 2A, the backup holder 15 applies vacuum suction force to the adhesive sheet 14 in a wide range covering not only the semiconductor element 13 to be subjected to the pushing-up process but also an area in which the semiconductor element 13 was already separated and taken up in the preceding pushing-up process.

Therefore, if the adhesive sheet 14 is broken in the preceding pushing-up process, vacuum suction force is also applied to the broken portion and the pressure will leak via the broken portion of the adhesive sheet 14 and cannot be sufficiently lowered so that the adhesive sheet 14 cannot be fixedly held. As a result, the semiconductor element 13 cannot be separated from the adhesive sheet.

Further, if the push-up pin 17 breaks through the adhesive sheet 14, the tip end portion of the push-up pin 17 is brought into direct contact with the rear surface of the semiconductor element 13 with large force, and in this case, the tip end portion of the push-up pin 17 may be damaged. At this time, the conventional element pushing-up device 30 continues the operation, the adhesive sheet is successively broken and the rear surface of another semiconductor element 13 is damaged by the damaged tip end portion of the push-up pin 17.

In the conventional element pushing-up device 30, since breakage of the adhesive sheet 14 cannot be detected until the die bonding process for a preset number (or one lot) of semiconductor elements is completed, a large number of defective devices will be produced when the breakage of the adhesive sheet is detected.

Thus, in the conventional element pushing-up device, the conditions of the shape of the tip end portion of the push-up pin 17, the traveling distance in the vertical direction, the moving speed, and the vacuum suction pressure are kept constant irrespective of the property of the adhesive of the adhesive sheet 14 and the area of the semiconductor element 13 and the operating state of the push-up pin 17 is not controlled according to different conditions.

SUMMARY OF THE INVENTION

An object of this invention is to provide a push-up pin used for separating a semiconductor element from an adhesive sheet in a die bonding apparatus which can prevent semiconductor devices from being made defective by preventing adhesive from being left behind on the rear surface of the semiconductor element and preventing the adhesive sheet from being broken when the semiconductor element is separated from the adhesive sheet by use of the push-up pin.

Another object of this invention is to provide a semiconductor element pushing-up device having an improved push-up pin or pins in a die bonding apparatus.

Another object of this invention is to provide a method for separating a semiconductor element by using an improved push-up pin of pins in a semiconductor element pushing-up device of a die bonding apparatus.

In order to attain the above objects, a push-up pin used for separating a semiconductor element attached by adhesive to an adhesive sheet of a semiconductor element pushing-up device in a die bonding apparatus of this invention from the adhesive sheet by pushing up the semiconductor element from the rear surface side of the adhesive sheet, comprises a tip end portion having a shape for applying pushing-up pressure with the thicknesses of the adhesive sheet and the adhesive kept constant when the pushing-up .pressure for pushing up the semiconductor element from the rear surface side of the adhesive sheet is applied; and a base portion for supporting the tip end portion.

A semiconductor element pushing-up device in a die bonding apparatus of this invention comprises at least one push-up pin which includes a tip end portion having a shape for applying pushing-up pressure with the thicknesses of an adhesive sheet and adhesive kept constant when the pushing-up pressure for separating a semiconductor element which is attached to the adhesive sheet via the adhesive from the adhesive sheet by pushing up the semiconductor element from the rear surface side of the adhesive sheet is applied, and a base portion for supporting the tip end portion; a pin holder for supporting the push-up pin to be movable in a vertical direction; a backup holder for receiving the push-up pin and the pin holder and used as a vacuum chamber having at least one through hole formed in the upper surface thereof for passage of the push-up pin; a vacuum device for drawing the adhesive sheet to which the semiconductor element is attached via the adhesive onto the upper surface of the backup holder to provide vacuum in the backup holder; and a drive control device for driving the pin holder in a vertical direction.

Further, a semiconductor element pushing-up device in a die bonding apparatus of this invention comprises at least one push-up pin which includes a tip end portion having a shape for applying pushing-up pressure with the thicknesses of an adhesive sheet and adhesive kept constant when the pushing-up pressure for separating a semiconductor element which is attached to the adhesive sheet via the adhesive from the adhesive sheet by pushing up the semiconductor element from the rear surface side of the adhesive sheet is applied, and a base portion for supporting the tip end portion; a pin holder for supporting the push-up pin to be movable in a vertical direction; a backup holder for receiving the push-up pin and the pin holder and used as a vacuum chamber having at least one through hole formed in the upper surface thereof for passage of the push-up pin; a vacuum device for drawing the adhesive sheet to which the semiconductor element is attached via the adhesive onto the upper surface of the backup holder to provide vacuum in the backup holder; drive control means for driving the pin holder in a vertical direction; means connected to the vacuum device, for measuring the vacuum suction pressure; and control means for controlling the operation of the push-up pin based on the result of measurement of the pressure measuring means.

Further, a semiconductor element pushing-up device in a die bonding apparatus of this invention comprises at least one push-up pin which includes a tip end portion having a shape for applying pushing-up pressure with the thicknesses of an adhesive sheet and adhesive kept constant when the pushing-up pressure for separating a semiconductor element which is attached to the adhesive sheet via the adhesive from the adhesive sheet by pushing up the semiconductor element from the rear surface side of the adhesive sheet is applied, and a base portion for supporting the tip end portion; a pin holder for supporting the push-up pin to be movable in a vertical direction; a backup holder for receiving the push-up pin and the pin holder and used as a vacuum chamber having at least one through hole formed in the upper surface thereof for passage of the push-up pin; a vacuum device for drawing the adhesive sheet to which the semiconductor element is attached via the adhesive onto the upper surface of the backup holder to provide vacuum in the backup holder; means connected to the pin holder, for measuring a load applied to the push-up pin; and control means for controlling the operating condition of the push-up pin based on the result of measurement of the load measuring means.

Further, a semiconductor element pushing-up device in a die bonding apparatus of this invention comprises at least one push-up pin which includes a tip end portion having a shape for applying pushing-up pressure with the thicknesses of an adhesive sheet and adhesive kept constant when the pushing-up pressure for separating a semiconductor element which is attached to the adhesive sheet via the adhesive from the adhesive sheet by pushing up the semiconductor element from the rear surface side of the adhesive sheet is applied and the semiconductor element is taken up by suction of a semiconductor element suction head, and a base portion for supporting the tip end portion; a pin holder for supporting the push-up pin to be movable in a vertical direction; a backup holder for receiving the push-up pin and the pin holder and used as a vacuum chamber having at least one through hole formed in the upper surface thereof for passage of the push-up pin; a vacuum device for drawing the adhesive sheet to which the semiconductor element is attached via the adhesive onto the upper surface of the backup holder to provide vacuum in the backup holder; means for applying a voltage between the element suction head and the push-up pin; means for measuring a current flowing between the element suction head and the push-up pin; and control means for controlling the operating condition of the push-up pin based on the result of measurement of the current measuring means.

Further, a method for separating a semiconductor element in a semiconductor element pushing-up device in a die bonding apparatus of this invention comprises the steps of fixedly holding an adhesive sheet to which the semiconductor element is attached by adhesive by vacuum suction in a vacuum condition; measuring vacuum suction pressure when the semiconductor element is pushed up from the rear surface side of the adhesive sheet by use of at least one push-up pin with the thicknesses of the adhesive sheet and the adhesive kept constant; and controlling the operating condition of the push-up pin based on the result of measurement.

Further, a method for separating a semiconductor element in a semiconductor element pushing-up device in a die bonding apparatus of this invention comprises the steps of fixedly holding an adhesive sheet to which the semiconductor element is attached by adhesive by vacuum suction in a vacuum condition; measuring a load applied to at least one push-up pin when the semiconductor element is pushed up from the rear surface side of the adhesive sheet by use of the push-up pin with the thicknesses of the adhesive sheet and the adhesive kept constant; and controlling the operating condition of the push-up pin based on the result of measurement of the load.

Further, a method for separating a semiconductor element in a semiconductor element pushing-up device in a die bonding apparatus of this invention comprises the steps of fixedly holding an adhesive sheet to which the semiconductor element is attached by adhesive by vacuum suction in a vacuum condition; applying a voltage between the element suction head and the push-up pin and measuring a current flowing between the element suction head and the push-up pin when the semiconductor element attached to the adhesive sheet by adhesive is pushed up from the rear surface side of the adhesive sheet by use of the push-up pin with the thicknesses of the adhesive sheet and the-adhesive kept constant, separated from the adhesive sheet and then taken up by suction of the semiconductor element suction head; and controlling the operating condition of the push-up pin based on the result of measurement of the current.

With the above construction, according to the push-up pin of this invention, since the adhesive will not be left behind on the rear surface of the semiconductor element and breakage of the adhesive sheet can be prevented when the semiconductor element attached to the adhesive sheet is separated, occurrence of defective semiconductor elements can be prevented.

Further, with the semiconductor element pushing-up device in the die bonding apparatus of this invention, the rear surface of the semiconductor element can be prevented from being damaged when the semiconductor element is separated from the adhesive sheet by use of the push-up pin, and if the push-up pin breaks through the adhesive sheet, the breakage of the adhesive sheet is detected to prevent defective semiconductor elements from being further produced.

Further, with the method for separating the semiconductor element in the semiconductor element pushing-up device in the die bonding apparatus of this invention, the rear surface of the semiconductor element can be prevented from being damaged when the semiconductor element is separated from the adhesive sheet by use of the push-up pin, and if the push-up pin breaks through the adhesive sheet, the breakage of the adhesive sheet is detected to prevent defective semiconductor elements from being further produced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 9A to 9C are enlarged side views showing different shapes of another push-up pin 27 of this invention;

FIG. 10 is an enlarged cross sectional view showing the states of the semiconductor element 13, adhesive sheet 14 and push-up pin 27 when the semiconductor element 13 is pushed up from the rear surface side of the adhesive sheet 14 by use of the push-up pin 27 of this invention shown in FIGS. 8A to 8D;

FIG. 13A is an enlarged top plan view showing a semiconductor substrate on a semiconductor element pushing-up device 30 according to another embodiment of a this invention;

FIG. 13B shows a cross section taken along the line XIIIB—XIIIB of FIG. 13A and the construction of peripheral devices of the semiconductor element pushing-up device 30;

FIGS. 14A to 14F show cross sections for illustrating the operation of the semiconductor element pushing-up device 30 on the left side of the drawing and show variations in the measured pressures for the respective operations on the right side of the drawing;

FIG. 17 is a flowchart for illustrating a method of controlling the semiconductor element pushing-up operation of this invention;

FIG. 18 is a flowchart for illustrating another method for controlling the semiconductor element pushing-up operation of this invention;

FIGS. 22A to 22H show cross sections for illustrating the operation of the semiconductor element pushing-up device 30 on the left side of the drawing and show variations in the measured pressures for the respective operations on the right side of the drawing;

FIG. 24 is a flowchart for illustrating a method for controlling the push-up operation of the push-up pin 27;

FIG. 28 is a cross sectional view showing the structure of the semiconductor element, for illustrating means for detecting the breakage of the adhesive sheet 14 and current flow;

FIG. 29 shows a cross section of the semiconductor element pushing-up device 30 of this invention and the construction of peripheral devices;

FIG. 30 is a flowchart for illustrating detection of the breakage of the adhesive sheet 14 by detecting the current; and FIG. 31 is a flowchart for illustrating another method for detecting the breakage of the adhesive sheet 14 by detecting the current.

DETAILED DESCRIPTION OF THE PREFERRED EMBODIMENTS

There will now be described embodiments of this invention with reference to the accompanying drawings.

Figure 6A:
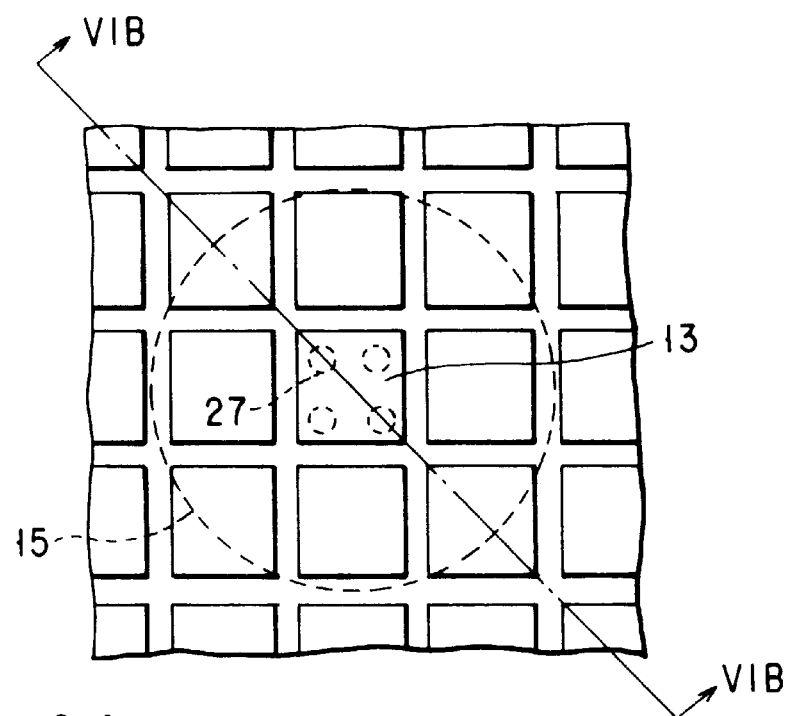
FIG. 6A is an enlarged top plan view showing a semiconductor substrate on a semiconductor element pushing-up device 30 according to one embodiment of this invention.

FIG. 6A is an enlarged top plan view showing a semiconductor substrate on a semiconductor element pushing-up device 30 according to an embodiment of this invention.

Figure 6B:
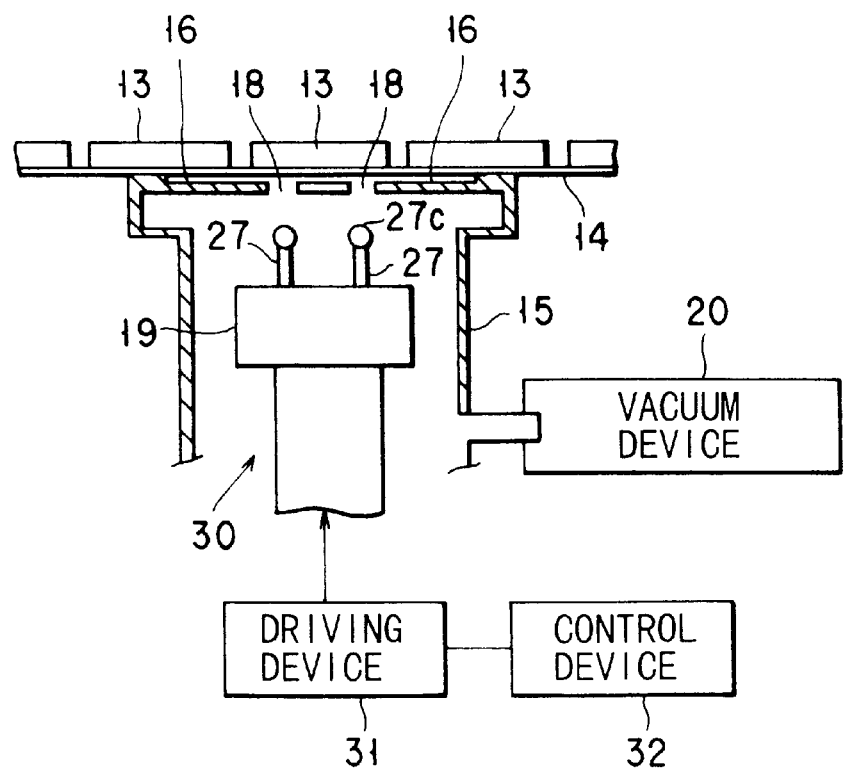
FIG. 6B shows a cross section taken along the line VIB—VIB of FIG. 6A and the construction of peripheral devices of the semiconductor element pushing-up device 30.

FIG. 6B shows a cross section taken along the line VIB—VIB of FIG. 6A and the semiconductor element pushing-up device 30.

Figure 1:
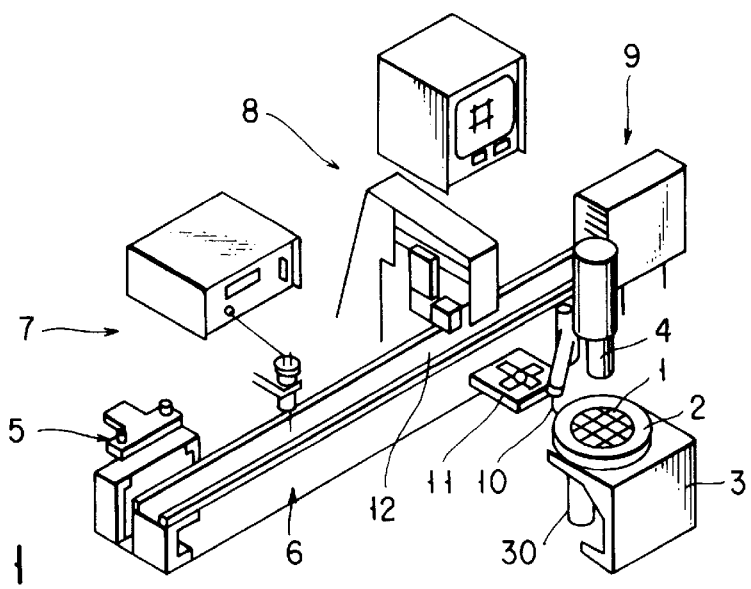
FIG. 1 is a schematic construction view showing a conventional die bonding apparatus.
Figure 2A:
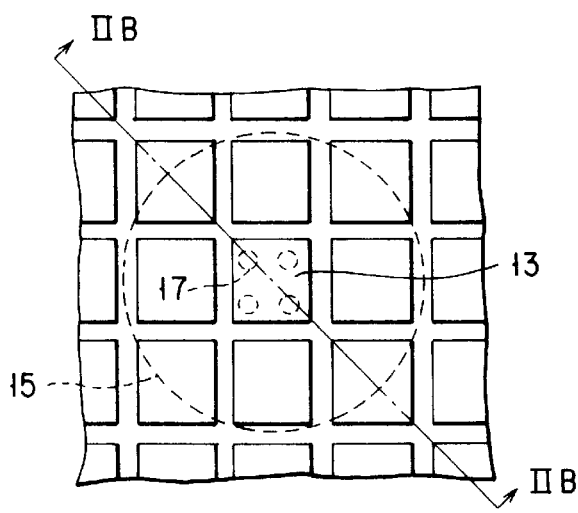
FIG. 2A is an enlarged top plan view showing a semiconductor substrate 1 on a semiconductor element pushing-up device 30 shown in FIG. 1.
Figure 2B:
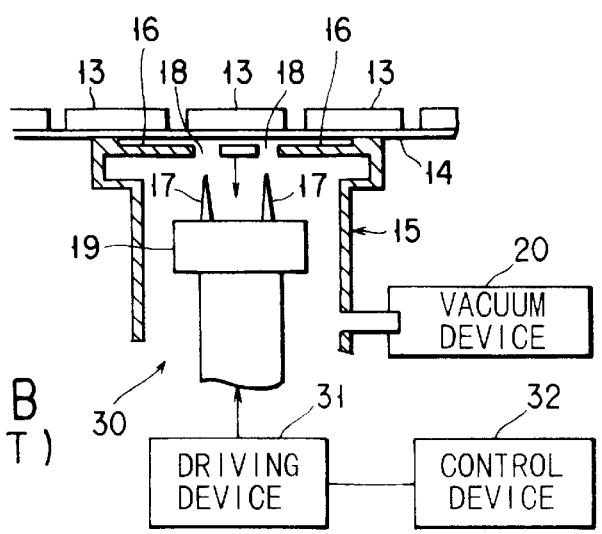
FIG. 2B shows a cross section taken along the line IIB—IIB of FIG. 2A and the construction of peripheral devices of the semiconductor element pushing-up device 30.
Figure 3A:
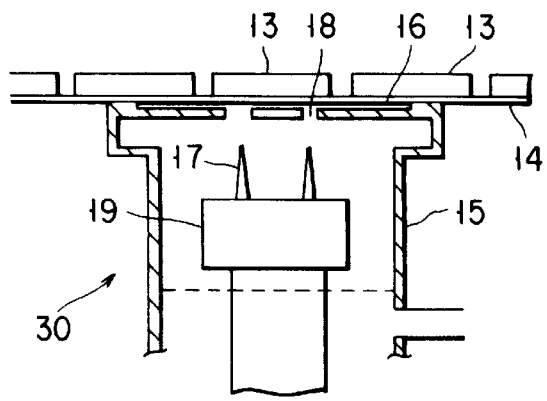
FIGS. 3A to 3D are cross sectional views for illustrating the operation of the semiconductor element pushing-up device 30.
Figure 3B:
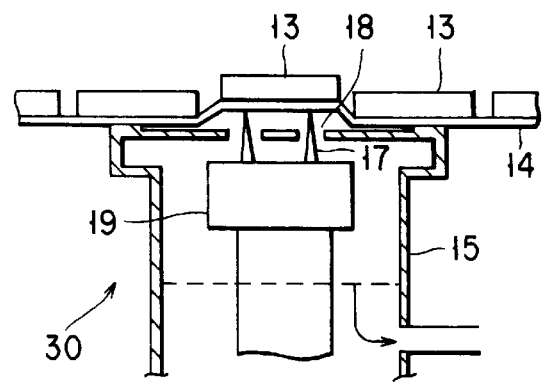
Figure 3C:
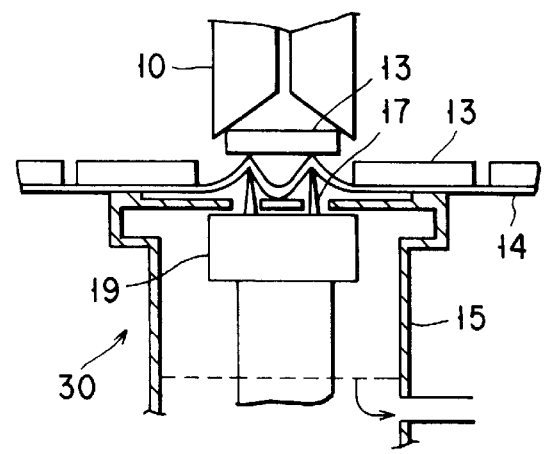
Figure 3D:
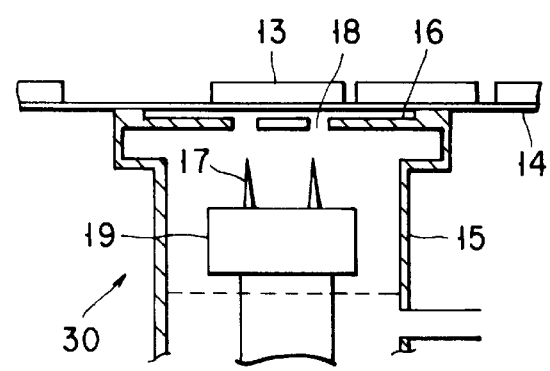
Figure 4:
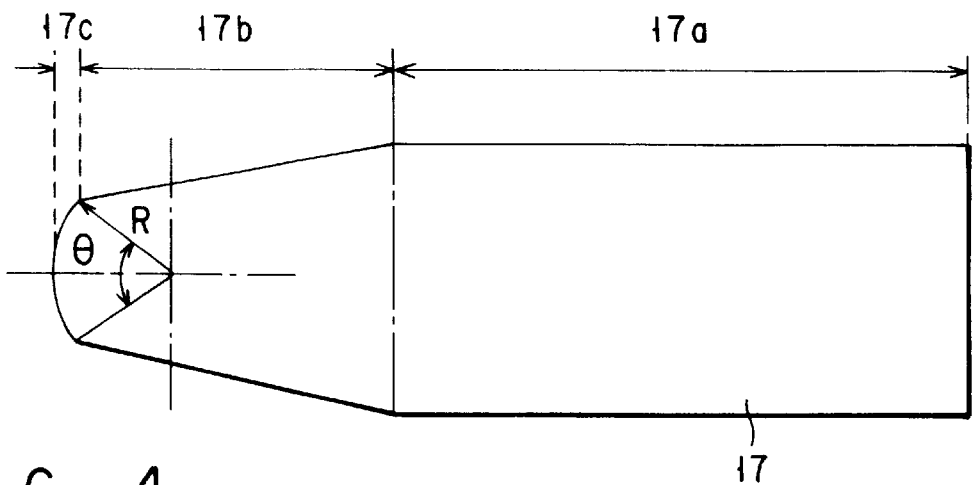
FIG. 4 is a side view showing a push-up pin 17 of the conventional element pushing-up device 30.
Figure 5:
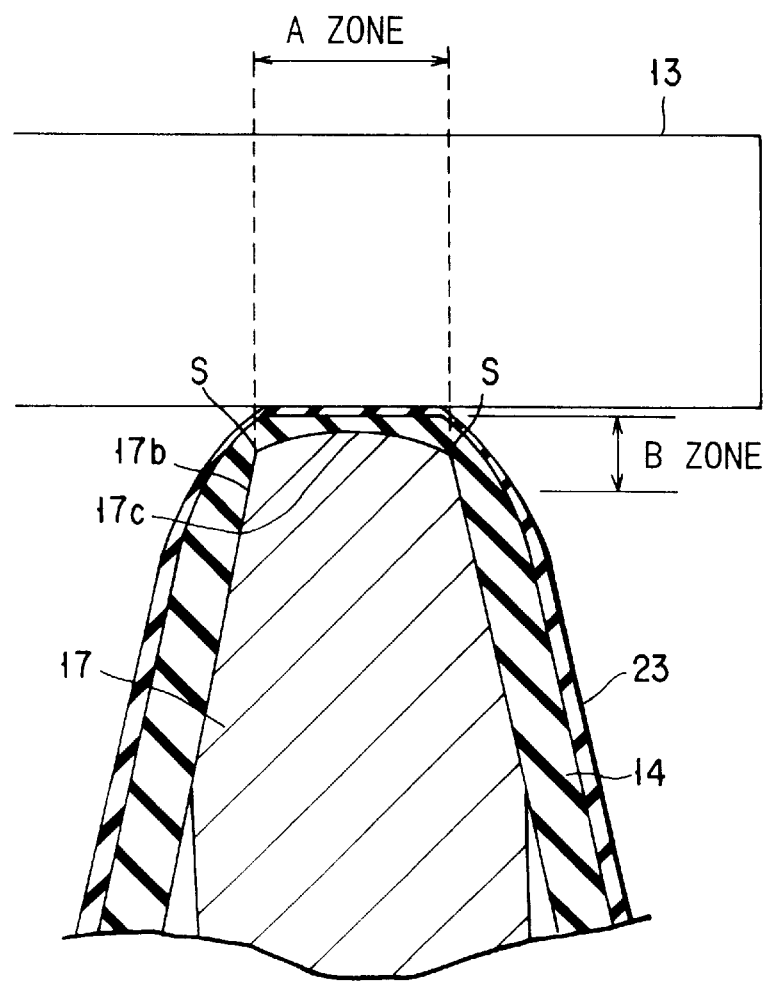
FIG. 5 is an enlarged view showing a state in which the push-up pin 17 pushes up the semiconductor element.

Like the conventional semiconductor element pushing-up device shown in FIGS. 2A and 2B, the semiconductor element pushing-up device 30 of this embodiment includes a backup holder 15, push-up pin 27, pin holder 19, pin holder driving device 31, control device 32, and vacuum device 20.

The backup holder 15 is a vacuum chamber having through holes 18 formed in the upper surface thereof and is used for fixedly holding an adhesive sheet 14 on the upper surface of the backup holder 15 by applying vacuum suction force to the same by use of the vacuum device 20 connected to the vacuum chamber.

Semiconductor elements 13 are attached to the adhesive sheet 14. The pin holder 19 capable of receiving a plurality of push-up pins 27 is inserted into the vacuum chamber of the backup holder 15 and the pin holder 19 is driven in the vertical direction by the driving device 31.

Unlike the prior art case, the push-up pin 27 has a rounded tip end portion 27c. The shape of the tip end portion will be described later in detail.

FIGS. 7A to 7D illustrate the operation of the semiconductor element pushing-up device 30.

Figure 7A:
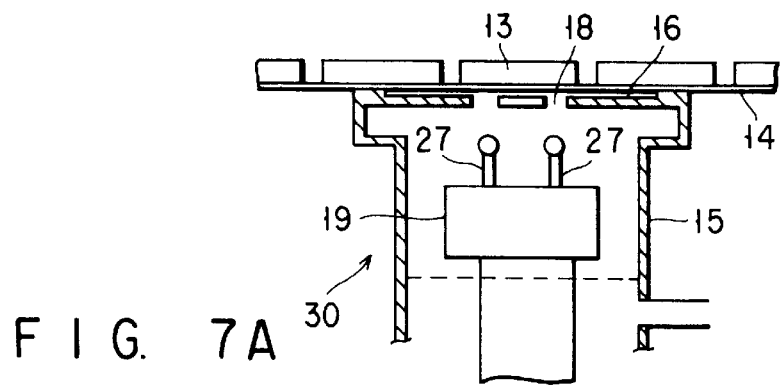
FIGS. 7A to 7D are cross sectional views for illustrating the operation of the semiconductor element pushing-up device 30.
Figure 7B:
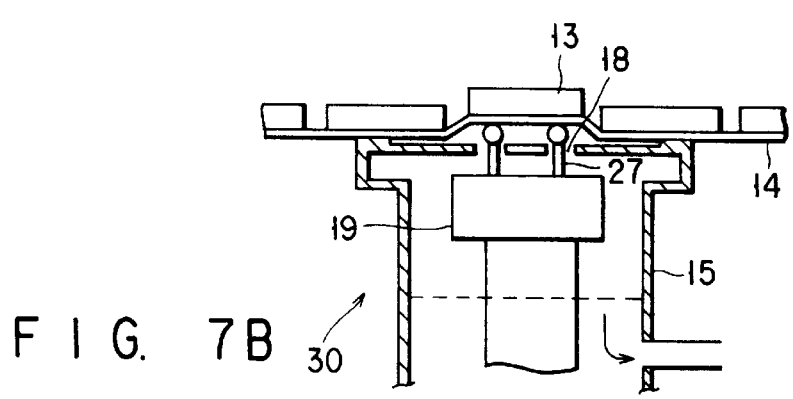

When the pin holder 19 is moved upwardly, the push-up pins 27 pass through the through holes 18 formed in the upper surface of the backup holder 15 to push up the semiconductor element 13 and the adhesive sheet 14 (FIG. 7B).

Figure 7C:
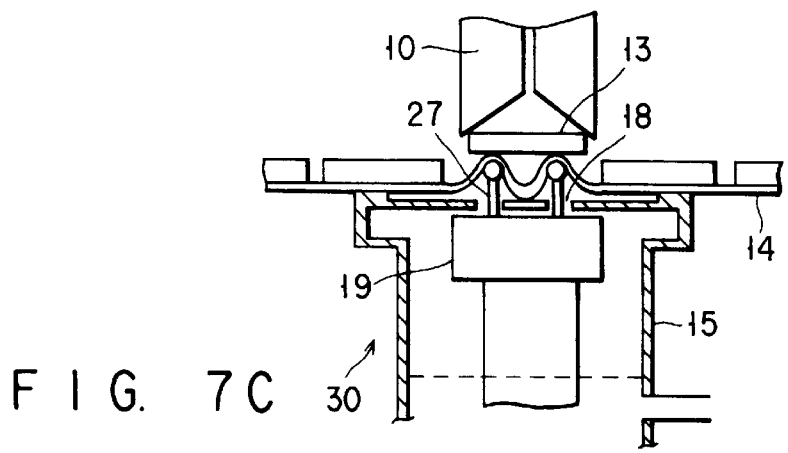
Figure 7D:
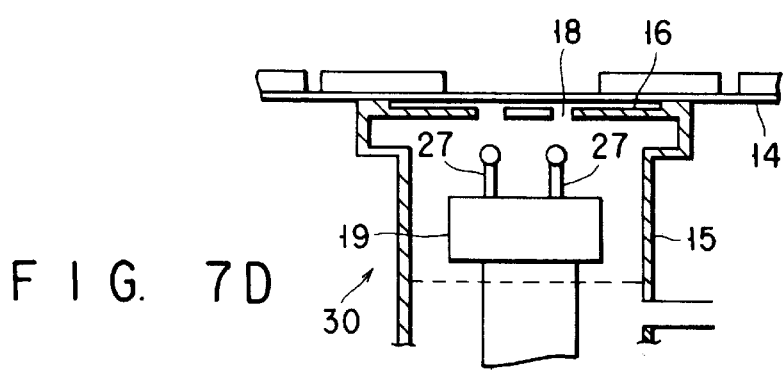

Since the adhesive sheet 14 is fixedly held on the backup holder 15 by the vacuum suction force, the semiconductor element 13 is separated from the adhesive sheet 14 and taken up by suction of the element suction head 10 (FIG. 7C). After this, the pin holder 19 is moved downwardly and the vacuum suction pressure is released (FIG. 7D).

The shape of the push-up pin 27 according to the first embodiment of this invention is explained in more detail with reference to FIGS. 8A to 8D which are enlarged side views.

Figure 8A:
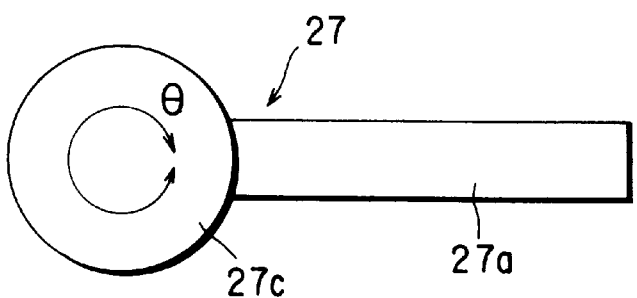
FIGS. 8A to 8D are enlarged side views showing different shapes of a push-up pin 27 of this invention.

The push-up pin 27 according to the first embodiment of this invention shown in FIG. 8A is formed of a spherical tip end portion 27c and a cylindrical base portion 27a, for example.

The spherical tip end portion 27c and the cylindrical base portion 27a can be bonded to each other by forming a concave portion in the tip end portion 27c, forming a convex portion which engages with the concave portion of the tip end portion in the base portion, and engaging them and bonding them by use of adhesive.

Figure 8B:
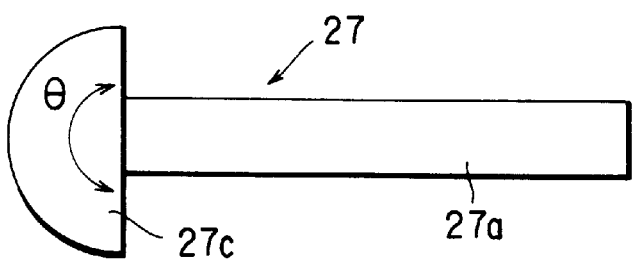

Further, the tip end portion 27c is not necessarily formed in a spherical form and may be formed in a semi-spherical form as shown in FIG. 8B.

Figure 8C:
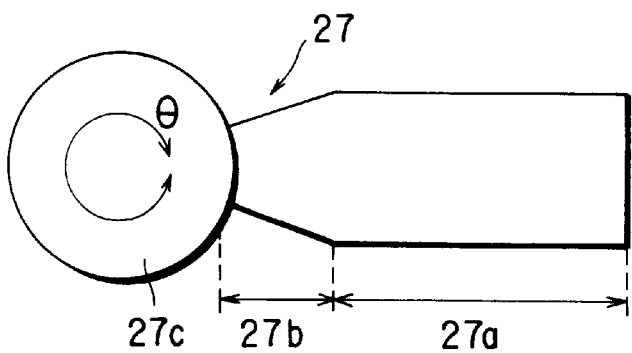
Figure 8D:
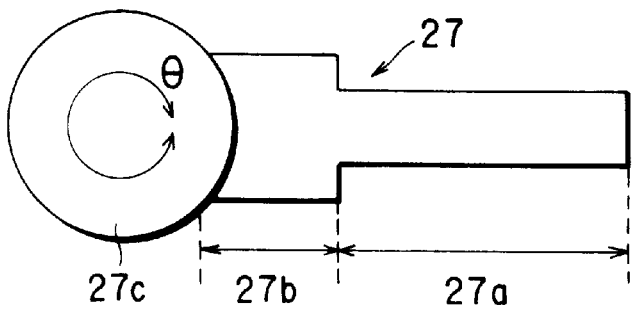

Further, as shown in FIGS. 8C and 8D, it is possible to form a coupling portion 27b of desired shape such as conical shape or cylindrical shape between the spherical tip end portion 27c and the cylindrical base portion 27a engaged into the pin holder 19.

The cross section of the base portion 27a or coupling portion 27b is not necessarily circular but can be formed in a desired shape such as a triangular form, polygonal form such as a square form, or elliptical form. In this case, however, the base portion 27a or coupling portion 27b must lie inside a circular area formed by the spherical portion of the tip end portion 27c when the image of a portion of the tip end portion 27c which passes through the through hole 18 of the backup holder 15 and rises to a level higher than the upper surface of the backup holder 15 is projected in a direction along the movement direction of the push-up pin 27.

Thus, in this embodiment, in the cross section containing the central axis of the push-up pin 27 as shown in FIG. 8D, the angle θ of circumference of a sector formed by the tip end portion 27c becomes equal to or larger than 180°.

In the above embodiment, it is preferable to form the tip end portion 27c by use of a material which is difficult to wear and, for example, it is formed of ruby, a ball of a ball bearing, or cemented carbide (obtained by, for example, sintering powder of extremely hard compound such as tungsten carbide with metal powder such as cobalt).

Since the base portion 27a and coupling portion 27b are less subject to wear than the tip end portion 27c, it is preferable to form them by use of a material whose hardness is less than the tip end portion 27c and which can be easily machined and they can be formed of hard metal or SUS, for example.

Further, the push-up pin 27 can be formed with a tip end portion 27c as shown in FIG. 9A by shaping the front end portion of a cylindrical base portion 27a into a semi-spherical form.

Also, in this embodiment, in the cross section containing the central axis of the push-up pin 27, the angle θ of circumference of a sector formed by the tip end portion 27c can be set to 180°.

As shown in FIG. 9B, for example, the base portion 27a can be formed of a circular cylinder thinner than the coupling portion 27b or a circular cylinder with a diameter different from that of the coupling portion.

Further, as shown in FIG. 9C, the base portion 27a can be made thick as a portion which will not pass through the through hole 18. In addition, the base portion is not limited to a circular cylindrical form and can be formed of an elliptical column, polygonal column or other column of different cross section.

The push-up pin 27 can be integrally formed by use of hard metal or SUS, for example.

In a case where the radius of the spherical surface of the tip end portion 27c is extremely small, the adhesive sheet 14 will be easily broken. Further, there occurs a possibility that it cannot withstand the load which increases with an increase in the area of the semiconductor element 13.

On the other hand, in a case where the radius of the spherical surface of the tip end portion 27c is extremely large, the contact area between the rear surface of the semiconductor element 13 and the push-up pin 27 increases and the adhesive 23 or adhesive sheet 14 tends to be left behind. Therefore, it is preferable to set the radius of the spherical surface of the tip end portion 27c in a range of 0.25 mm to 0.99 mm, for example.

FIG. 10 is an enlarged cross sectional view showing the states of the semiconductor element 13, adhesive sheet 14 and push-up pin 27 when the semiconductor element 13 is pushed up from the rear surface side of the adhesive sheet 14 by use of the push-up pin 27 shown in FIGS. 8A to 8D.

In this case, if the tip end portion 27c of the push-up pin 27 is divided into two semi-spheres along a cross section perpendicular to a direction of movement of the push-up pin, one of the semi-spheres which lies on the semiconductor element 13 side is indicated by C1 and the other semi-sphere which lies on the base portion 27a side is indicated by C2, then the boundary line S between the tip end portion 27c and the adhesive sheet 14 lies on the spherical surface of the semi-sphere C1.

That is, the inflection point of the boundary line S between the tip end portion 27c and the adhesive sheet 14 lies on the spherical surface of the semi-sphere C1.

Therefore, unlike the conventional case, the adhesive sheet 14 and the adhesive 23 will not be extremely expanded and made thin particularly on the boundary line S and the adhesive sheet 14 and the adhesive 23 can be uniformly expanded along the spherical surface of the tip end portion 27c of the push-up pin 27.

Since the adhesive 23 will not be partially made thin in a particular portion (on the boundary line S) or the adhesive strength between the adhesive sheet 14 and the adhesive 23 will not be weaken, the adhesive 23 can be prevented from being separated from the adhesive sheet 14 and attached to the rear surface of the semiconductor element 13.

Further, since the adhesive 23 will not be partially made thin in a particular portion (on the boundary line S), the adhesive sheet 14 will not be easily broken even if the push-up pin 27 is pushed up with relatively large force.

The adhesive sheet 14 and the adhesive 23 can be uniformly expanded in a spherical form along the shape of the tip end portion 27c of the push-up pin. Therefore, the adhesive 23 and the adhesive sheet 14 are set in contact with the rear surface of the semiconductor element 13 at substantially one point and the adhesive 23 and the adhesive sheet 14 will not be left behind on the rear surface of the semiconductor element 13.

As described above, a difference between the push-up pin of this invention and the conventional push-up pin has been explained with reference to FIG. 10, but as shown in FIGS. 9A to 9C, the adhesive sheet 14 and the adhesive 23 can be uniformly expanded along the spherical surface of the tip end portion 27c of the push-up pin 27 in the other embodiments in which the tip end portion 27c of the push-up pin is formed in a semi-spherical form.

Further, the tip end portion 27c of the push-up pin is not necessarily formed in a strictly semi-spherical form if it takes a form which permits the adhesive sheet 14 and the adhesive 23 to be substantially uniformly expanded because the inflection point of the boundary line S is extremely smooth.

Figure 11:
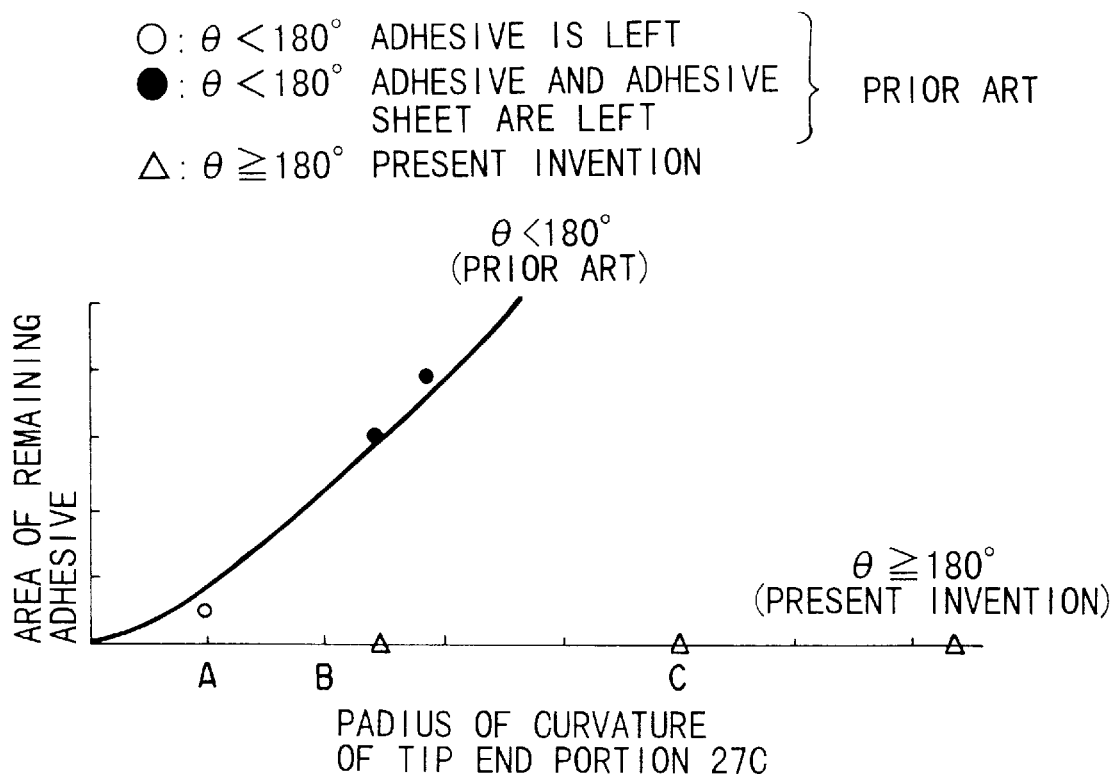
FIG. 11 is a diagram showing the,result of comparison between the area of the adhesive left behind on the rear surface of the semiconductor element and the area of the adhesive sheet when the radius of curvature of the spherical surface of the tip end portion to compare the push-up pin 27 of this invention with the conventional push-up pin.

FIG. 11 shows the result of measurements of the area of the adhesive 23 left behind on the rear surface of the semiconductor element 13 and the area of the adhesive sheet 14 when the radius of curvature of the spherical surface of the tip end portion is changed by use of the push-up pin 27 of this invention and the conventional push-up pin 17. The area of the semiconductor element 13 is 400 mm$^2$.

As shown in FIG. 11, the adhesive is always left behind on the rear surface of the semiconductor element 13 in the conventional case and if the radius of curvature of the tip end portion 27c is increased, the adhesive sheet 14 of larger area is left behind, but with the push-up pin of this embodiment, the adhesive 23 and the adhesive sheet 14 are not at all left behind on the rear surface of the semiconductor element 13 in a wide range of the radius of curvature.

Figure 12:
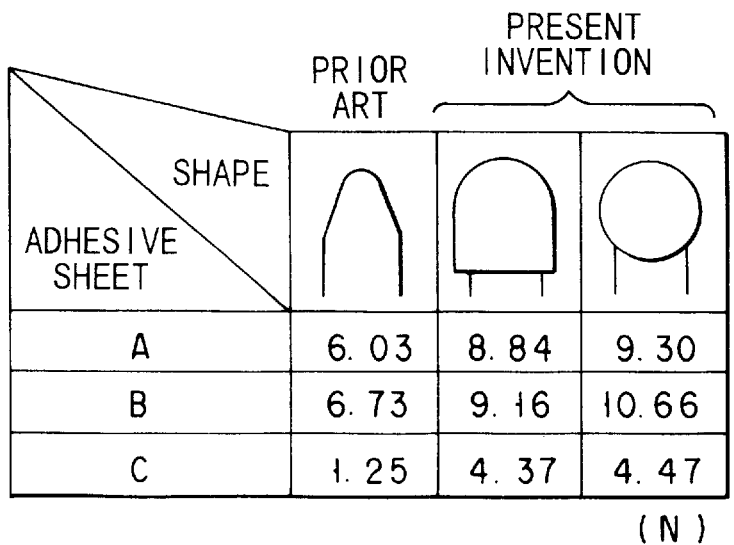
FIG. 12 shows the result of measurements of forces applied to the push-up pin when the adhesive sheet 14 is broken by use of adhesive sheets of different adhesions by using the push-up pin 27 of this invention and the conventional push-up pin 17 shown in FIG. 2B.

FIG. 12 shows the result of measurements of forces applied to the push-up pin when the adhesive sheet 14 is broken by use of adhesive sheets of different adhesions by using the push-up pin 27 of this invention and the conventional push-up pin 17 shown in FIG. 2B.

Symbols A, B, C respectively indicate adhesive sheets of different adhesions.

It is understood from FIG. 12 that the adhesive sheet 14 will not be broken even if a load larger than the conventional case is applied in a case where the push-up pin 27 of this invention is used for any type of adhesive sheet of different adhesives.

Thus, with the push-up pin 27 of this invention, the adhesive sheet 14 and the adhesive 23 can be prevented from being left behind on the rear surface of the semiconductor element 13. Therefore, it becomes possible to solve the problem that a crack is caused in the plastic package by the presence of the above foreign matters attached to the rear surface of the semiconductor element 13 after the semiconductor element 13 is sealed into the plastic package and the semiconductor device is manufactured.

Further, if the push-up pin 27 of the above embodiment is used, the adhesive sheet 14 will not be broken even when a load larger than the conventional case is applied. Therefore, if the area of the semiconductor element 13 is increased and a load required for separating the semiconductor element 13 from the adhesive sheet 14 is increased, there occurs no possibility that the push-up pin 27 will break through the adhesive sheet 14 to produce damage such as scratch or crack on the rear surface of the semiconductor element 13.

Therefore, it becomes possible to solve the problem that a crack is caused in the semiconductor element by the presence of the above damage formed on the rear surface of the semiconductor element 13 after the semiconductor element 13 is sealed into the plastic package and the semiconductor device is manufactured.

Thus, by using the above-described push-up pin 27, breakage of the adhesive sheet 14 can be prevented, but at the same time, it is true that the possibility of breakage of the adhesive sheet 14 caused by various factors such as an increase in the area of the semiconductor element 13 cannot be completely eliminated.

Therefore, a method for basically preventing breakage of the adhesive sheet 14 by use of the push-up pin 27 of this invention and suppressing the damage to minimum even if the adhesive sheet 14 is accidentally broken is explained below.

As indicated by the top plan view of the semiconductor substrate on the semiconductor element pushing-up device 30 shown in FIG. 13A, the cross sectional view of FIG. 13B taken along the line XIIIB—XIIIB of FIG. 13A and the construction of peripheral devices of the semiconductor element pushing-up device 30, there is provided a mechanism for measuring the pressure in the vacuum chamber of the backup holder 15 and detecting that the push-up pin 27 breaks through the adhesive sheet 14 based on the fact that the pressure rises when the pressure has leaked.

Like the semiconductor element pushing-up device shown in FIGS. 6A and 6B, the semiconductor element pushing-up device 30 includes a backup holder 15, push-up pin 27, pin holder 19, pin holder driving device 31, control device 32, and vacuum device 20.

It additionally includes a unit 33 for measuring the pressure in the vacuum chamber of the backup holder 15, a storage unit 34 for storing initial data measured by the pressure measuring unit 33 before the pushing-up operation, and a determining unit 35 for determining breakage of the adhesive sheet 14 by observing a variation in the pressure by comparing the initial data with the pressure in the vacuum chamber measured by the pressure measuring unit 33 during or after the pushing-up operation.

Further, the control device 32 of the semiconductor element pushing-up device 30 includes a mechanism for controlling the operation of the pin holder driving device 31 based on the result of determination by the mechanism for determining breakage of the adhesive sheet 14.

Next, the operation of the semiconductor element pushing-up device 30 and a variation in the measured pressure are explained with reference to FIGS. 14A to 14F and FIGS. 15A to 15H.

The cross sections of the semiconductor element pushing-up device 30 are shown on the left side of the drawing and variations in the measured pressure are shown on the right side of the drawing.

FIG. 14A shows a state prior to the operation of the push-up pins 27 to break through the adhesive sheet 14 in the process of separating the semiconductor element 13 from the adhesive sheet 14.

First, the adhesive sheet 14 is fixedly held on the backup holder 15. At this time, pressure necessary for separating the semiconductor element 13 from the adhesive sheet 14 when the semiconductor element 13 is pushed up is previously set. It is necessary to adequately set the pressure since it depends on the area of the semiconductor element 13 and the property of the adhesive 23.

Before starting the pushing-up operation, the adhesive sheet 14 is mounted on the backup holder 15 and vacuum suction of the vacuum chamber is started to fixedly hold the adhesive sheet 14 on the backup holder 15. At this time, the control device does not operate the pin holder driving device 31 shown in FIG. 13B until the pressure in the vacuum chamber reaches the previously set value and the pin holder 19 does not start to move upwardly (FIG. 14A) (FIG. 14B).

After the pressure in the vacuum chamber has reached the previously set value (point P) (FIG. 14D), the control device 32 operates the pin holder driving device 31 and the pin holder 19 starts to move upwardly. Then, the push-up pins 27 pass through the holes 18 of the backup holder 15 to push up the semiconductor element 13 on the adhesive sheet 14 from the rear surface side thereof (FIG. 14C).

At this time, as shown in FIG. 14E, if the push-up pins 27 break through the adhesive sheet 14, the pressure leaks via the broken portions and the measured pressure is temporarily lowered (point Q) (FIG. 14F).

The control device 32 shown in FIG. 13B detects the variation in the pressure, interrupts the operation of the pin holder driving device 31, and gives information to this effect to the operator by issuing an alarm sound or using a monitor television.

FIGS. 15A to 15H show a case wherein the push-up pins 27 break through the adhesive sheet 14 after the semiconductor element 13 is separated from the adhesive sheet 14.

Figure 15A:
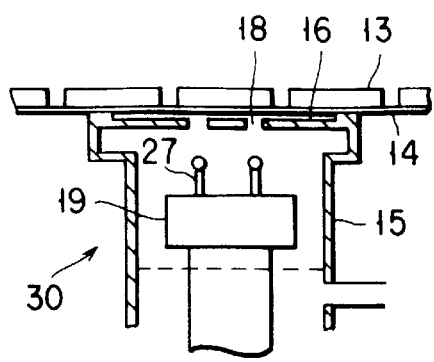
FIGS. 15A to 15H show cross sections for illustrating another operation of the semiconductor element pushing-up device 30 on the left side of the drawing and show variations in the measured pressures for the respective operations on the right side of the drawing.
Figure 15B:
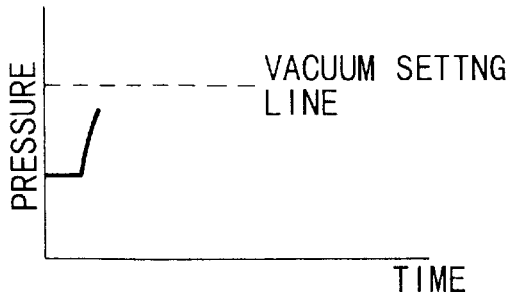

Like the case explained with reference to FIGS. 14A to 14F, the pressure in the vacuum chamber is previously set. The adhesive sheet 14 having the semiconductor elements 13 attached thereto is mounted on the backup holder 15 and vacuum suction of the vacuum chamber is started to fix the adhesive sheet 14 on the backup holder 15 (FIG. 15A).

Figure 15C:
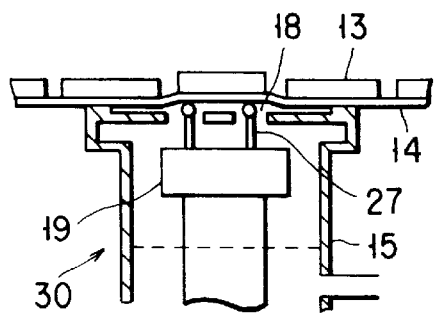
Figure 15D:
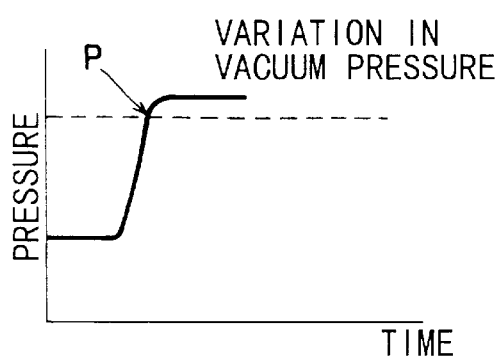

After the pressure in the vacuum chamber has reached the previously set value (point P) (FIG. 15B), the control device 32 operates the pin holder driving device 31 and the pin holder 19 starts to move upwardly. Then, the push-up pins 27 pass through the holes 18 of the backup holder 15 to push up the semiconductor element 13 on the adhesive sheet 14 from the rear surface side thereof (FIG. 15C).

Figure 15E:
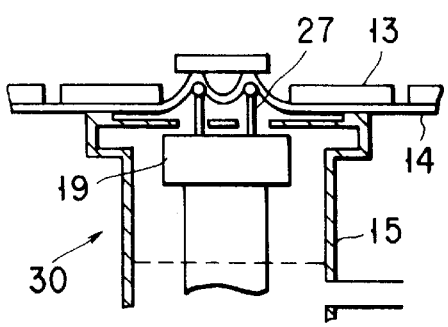

The semiconductor device 32 is separated from the adhesive sheet 14 by successively pushing up the pushup pins 27 (FIG. 15E).

Figure 15F:
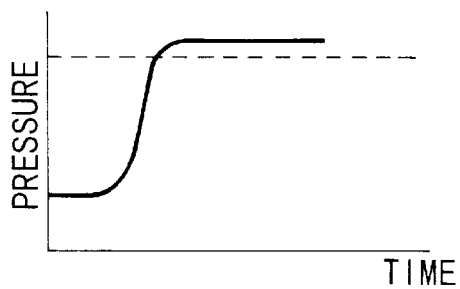

At this time, the pressure in the vacuum chamber is kept unchanged (FIG. 15F).

Figure 15G:
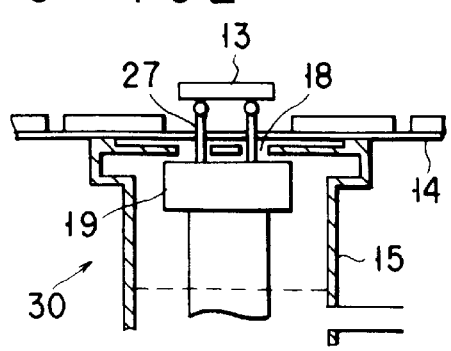
Figure 15H:
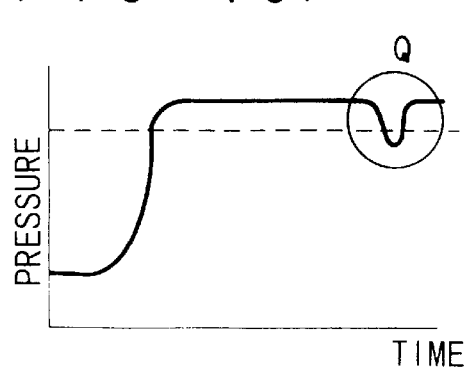

Further, as shown in FIG. 15G, if the push-up pins 27 break through the adhesive sheet 14, the pressure leaks via the broken portions and the measured pressure is temporarily lowered (point Q) (FIG. 15H).

The control device 32 detects the variation in the pressure, interrupts the operation of the pin holder driving device 31, and gives information to this effect to the operator by issuing an alarm sound or using a monitor television.

Figure 16A:
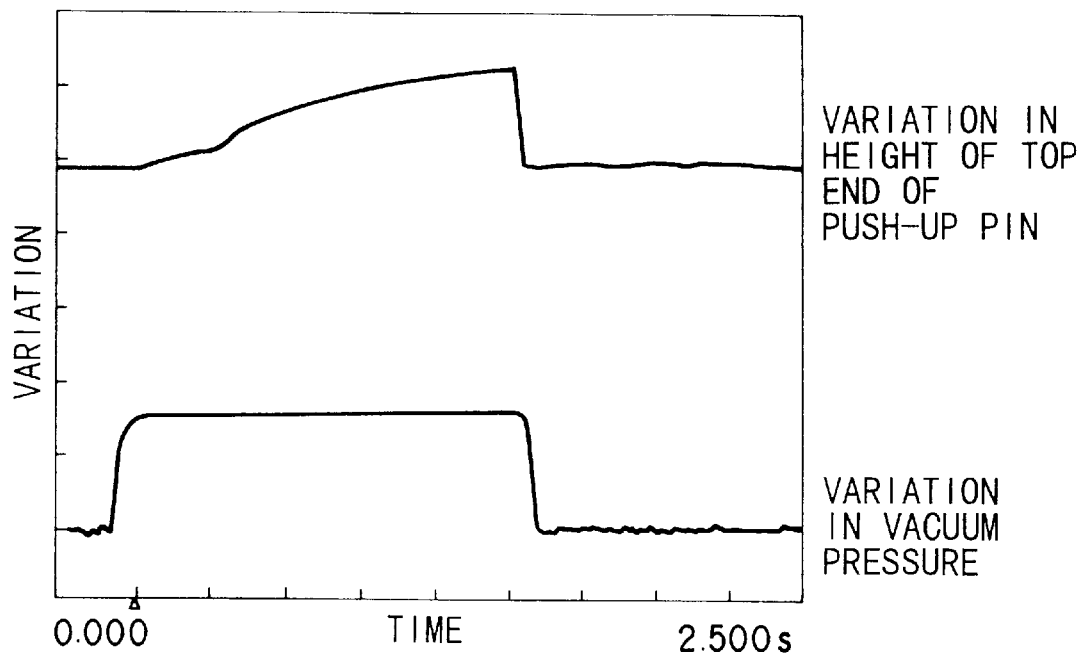
FIG. 16A is a diagram showing the actually measured value of a variation in the pressure in a vacuum chamber and a variation in the height of the push-up pin 27.

FIG. 16A shows the actually measured value of a variation in the pressure in the vacuum chamber in a state in which the push-up pin 27 does not break through the adhesive sheet 14 and a variation in the height of the push-up pin 27.

Figure 16B:
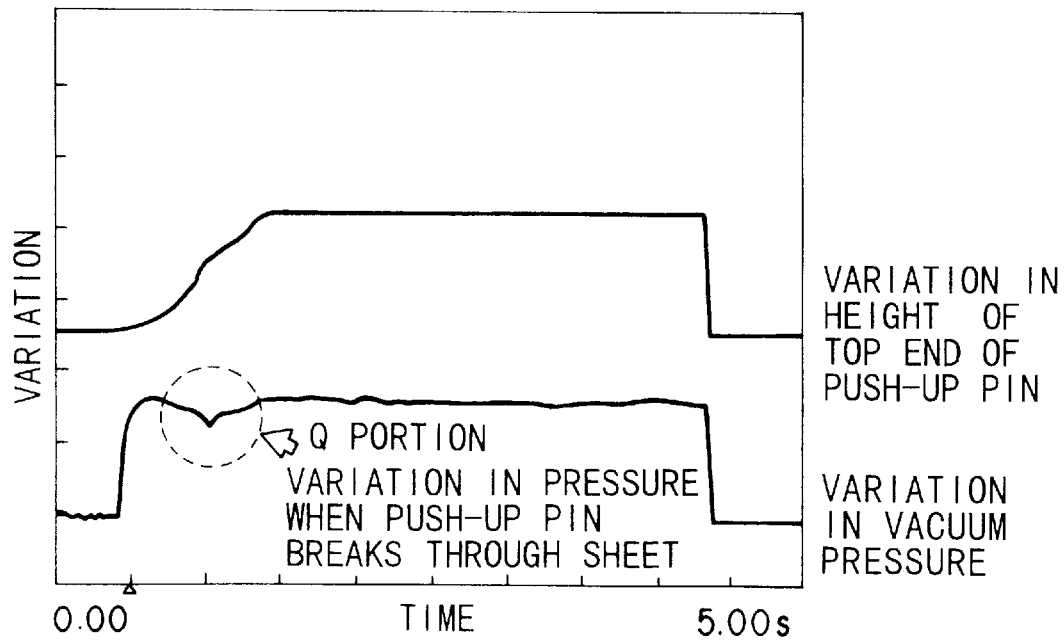
FIG. 16B is a diagram showing the measured value of a variation in the pressure in a vacuum chamber and a variation in the height of the push-up pin 27 when the push-up pin 27 breaks through the adhesive sheet 14.

FIG. 16B shows the measured value of a variation in the pressure in the vacuum chamber when the push-up pin 27 has broken through the adhesive sheet 14 and a variation in the height of the push-up pin 27 when the push-up pin 27 breaks through the adhesive sheet 14.

As indicated by a Q portion in FIG. 16B, if the push-up pin 27 breaks through the adhesive sheet 14, the observed pressure is lowered than in the normal case.

Therefore, breakage of the adhesive sheet can be correctly detected by always measuring the pressure in the vacuum chamber and comparing a waveform created by the measured values with the waveform obtained in the normal case.

FIGS. 17 and 18 are flowcharts for illustrating the methods for controlling the semiconductor element pushing-up operation.

In either method, since it is necessary to change the pressure in the vacuum chamber required for separating the semiconductor element from the adhesive sheet 14 if the area of the semiconductor element is changed according to the change of the type of the semiconductor element, for example, it becomes necessary to set the pressure in the vacuum chamber to such a value that the push-up pin will not break through the adhesive sheet 14 when the operation of pushing up the semiconductor element 13 is effected after the change of the area, and for this purpose, the actual pressure in the vacuum chamber is measured and the pressure waveform is stored as new initial data.

After this, the pressure in the vacuum chamber is measured after the vacuum-ON time and the pushing-up operation is successively effected for each of a plurality of semiconductor elements while comparing the pressure in the vacuum chamber with the initial data. The flowchart used at this time is shown in FIG. 17.

A case wherein the pressure in the vacuum chamber is measured while the pushing-up operation is being effected for one semiconductor element, the measured pressure waveform is stored and the waveform is compared with the waveform of initial data is shown in FIG. 18.

First, the flowchart of FIG. 17 is explained.

If the area of the semiconductor element is changed according to the change of the type of the semiconductor element, for example, the pressure in the vacuum chamber required for separating the semiconductor element from the adhesive sheet 14 after the change of the area is changed, and therefore, the pressure is measured (S1) and the pressure waveform is stored as new initial data.

Next, vacuum suction of the adhesive sheet 14 is started (S2) and the operation of moving the push-up pin upwardly is started (S3). At this time, whether the vacuum pressure in the vacuum chamber leaks or not is always determined (S5) by always measuring the pressure in the vacuum chamber (S4) and comparing the measured pressure with the previously stored initial data.

In this case, if the pressure leakage is detected, the control device determines that the adhesive sheet 14 may be broken and immediately interrupts the operation of the device and gives information to this effect to the operator by issuing an alarm sound or the like (S6).

The operator investigates the cause, takes an adequate measure (S7) and then starts the next semiconductor element pushing-up operation (S10).

On the other hand, if no pressure leakage is detected, the push-up pin is further moved upwardly until it reaches the highest point of push-up, and at the same time, the pressure in the vacuum chamber is always measured to always determine whether the pressure leakage occurs or not.

After the push-up pin has reached the highest point of push-up (S8), the push-up pin is moved downwardly (S9) and the pushing-up operation for the next semiconductor element is effected under a condition that no warning operation is effected (S10).

Next, the flowchart of FIG. 18 is explained.

Unlike the case of FIG. 17 in which the pressure in the vacuum chamber is measured for each of a plurality of semiconductor elements after the vacuum-ON time and determination of pressure leakage is always made, in this method, the pressure measured while the pushing-up operation is being effected for one semiconductor element is stored as a waveform and the waveform is compared with the waveform of initial data when the pushing-up operation for one semiconductor element is completed so as to determine whether the pressure leakage has occurred or not.

The process other than the operation of checking occurrence of the pressure leakage after completion of the pushing-up operation (S16) is effected in the same manner as in the flowchart of FIG. 17.

In the case of FIG. 18, since it is sufficient to check occurrence of the pressure leakage only once for one semiconductor element, the pressure leakage determining unit is not required to have high-operation speed and can be easily realized.

On the other hand, in the case of FIG. 17, since the pressure is always measured and determination of the pressure leakage is always made, the operation of the device can be immediately interrupted when the pressure leakage has occurred. Therefore, damage to the semiconductor element can be suppressed and the cause of the pressure leakage can be easily detected.

Thus, since the semiconductor element pushing-up device 30 of this invention includes a measuring unit 33 for measuring the pressure in the vacuum chamber and a control device 32 for detecting breakage of the adhesive sheet 14 based on a reduction in the measured value of the pressure, interrupting the operation of the device and giving information to this effect to the operator, it is possible to prevent the operation from being continuously effected in a state in which the adhesive sheet 14 is broken.

Thus, it is possible to solve the problem of the conventional semiconductor element pushing-up device that the adhesive sheet 14 cannot be sufficiently drawn by vacuum suction force and fixedly held and the semiconductor element 13 cannot be separated from the adhesive sheet 14 if the operation is continuously effected after the adhesive sheet 14 has been broken.

Further, in the conventional semiconductor element pushing-up device 30, since breakage of the adhesive sheet 14 cannot be detected until the process for a preset number (or one lot) of semiconductor elements is completed, there occurs a problem that a large number of defective products may be already made when breakage of the adhesive sheet 14 is detected, but in the semiconductor element pushing-up device 30 according to the following embodiment of this invention, such a problem can be solved.

In the above embodiment, breakage of the adhesive sheet 14 is checked by comparing a waveform created by the measured values of the pressure with the waveform obtained in the normal case, but it is also possible to check breakage of the adhesive sheet 14 based on the absolute value of the measured value of the pressure, for example.

Further, it is necessary to newly store the initial data at least when the area of the semiconductor element is changed according to the change of the type of the semiconductor element, but in order to prevent occurrence of the erroneous operation caused by variations in the adhesive sheets or devices, it is desirable to set the initial data each time a certain period of time has passed even if the type or the like is not changed.

Figure 19:
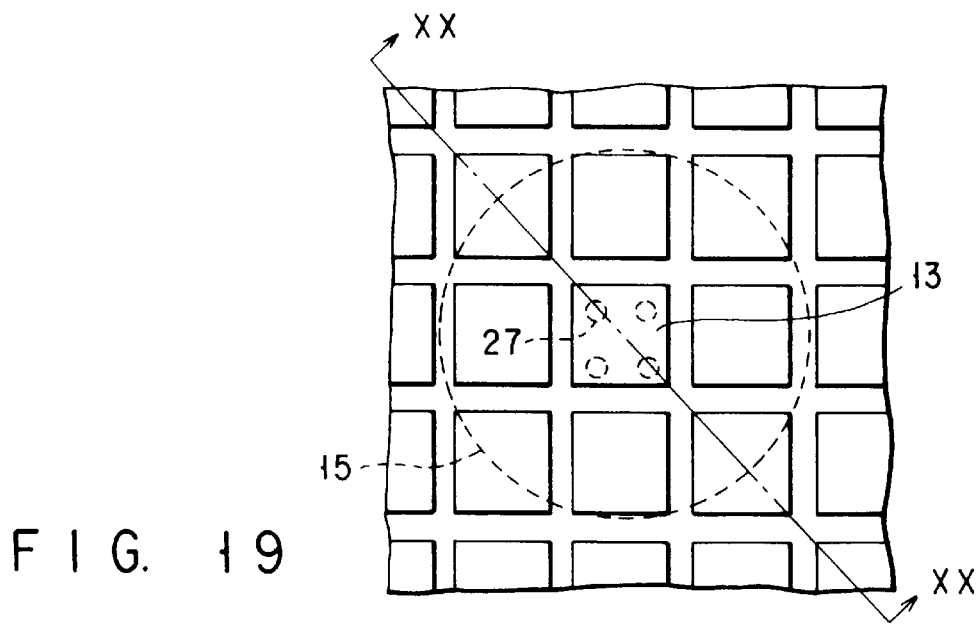
FIG. 19 is an enlarged top plan view showing a state in which a semiconductor element is placed on the upper surface of a portion of a backup holder 15 of a semiconductor element pushing-up device 30 according to still another embodiment of this invention.
Figure 20:
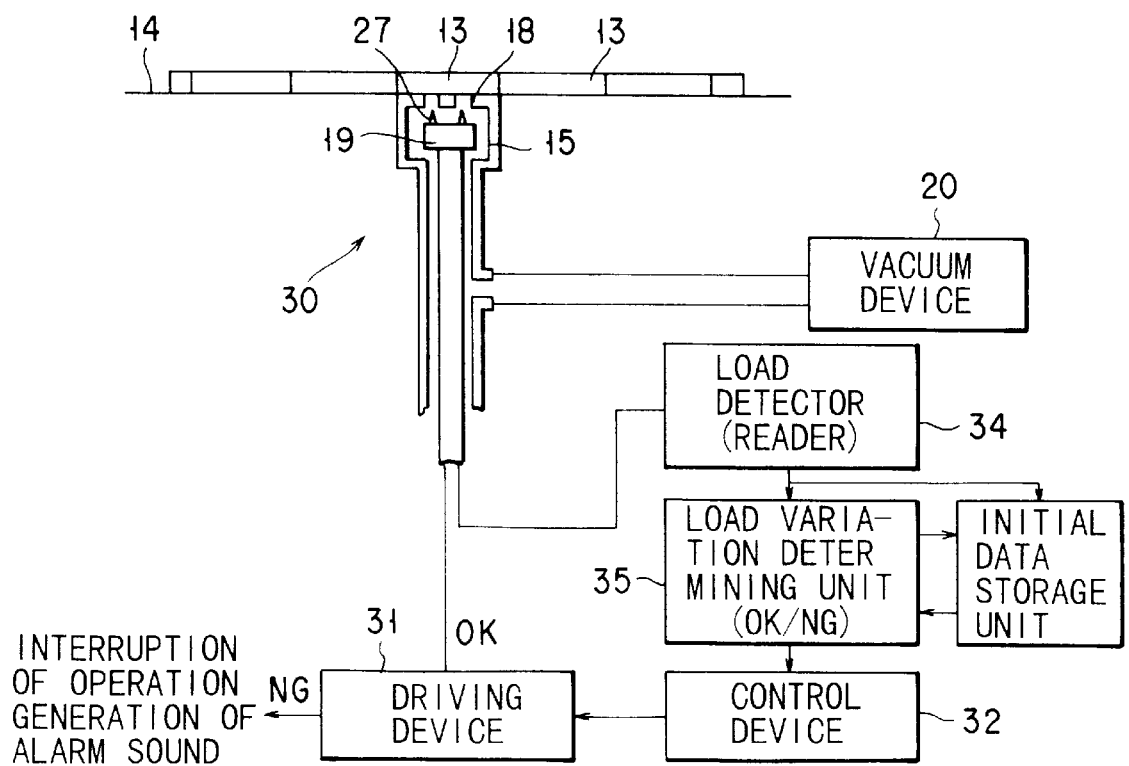
FIG. 20 shows a cross section taken along the line XX—XX of FIG. 19 and the construction of peripheral devices.

Next, a semiconductor element pushing-up device 30 having a mechanism for measuring a load applied to the push-up pin 27 and detecting that the push-up pin 27 breaks through the adhesive sheet 14 based on a reduction in the load is shown as still another embodiment in FIGS. 19 and 20.

FIG. 19 is an enlarged top plan view showing a semiconductor element placed on the semiconductor element pushing-up device 30 and FIG. 20 shows a cross section taken along the line XX—XX of FIG. 19 and the construction of peripheral devices.

The semiconductor element pushing-up device 30 includes a backup holder 15, push-up pin 27, pin holder 19, pin holder driving device 31, control device 32, and vacuum device 20 whose constructions are the same as those used in the former embodiment.

It additionally includes a unit 34 such as a strain gage for measuring a load applied to the pushing-up pin 27, and a determining unit 35 for determining whether the operation is to be continued or not by comparing the load value measured by the measuring unit 34 with previously measured initial data and detecting a variation in the load value.

Further, the control device 32 includes a mechanism for controlling the operation of the pin holder driving device 31 based on the result of determination by the determining unit 35.

Next, the operation of the semiconductor element pushing-up device 30 shown in FIG. 20 is explained with reference to FIGS. 21A to 21H and FIGS. 22A to 22H.

The cross sections of the semiconductor element pushing-up device 30 in the respective steps of the operation are shown on the left side of the drawing and variations in the height of the push-up pin 27 and variations in the measured loads are shown on the right side of the drawing.

Figure 21A:
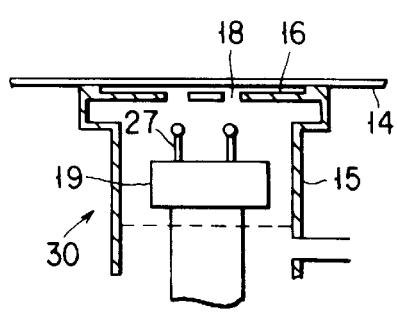
FIGS. 21A to 21H show cross sections for illustrating the operation of the semiconductor element pushing-up device 30 on the left side of the drawing and show variations in the measured pressures for the respective operations on the right side of the drawing.

The adhesive sheet 14 having no semiconductor elements 13 attached thereto is mounted on the backup holder 15 and vacuum suction of the vacuum chamber is started to fixedly hold the adhesive sheet 14 on the backup holder 15 (FIG. 21A).

Figure 21B:
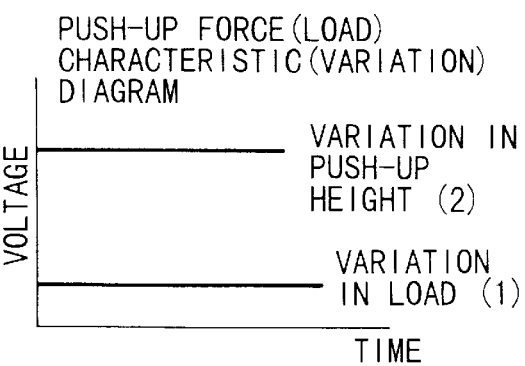

At this time, a sequence of steps of the pushing-up operation are effected by using the adhesive sheet 14 having no semiconductor elements 13 attached thereto as shown in FIG. 21B, the load applied to the push-up pin 27 is measured and the fact that there occurs no variation in the load is confirmed.

Figure 21C:
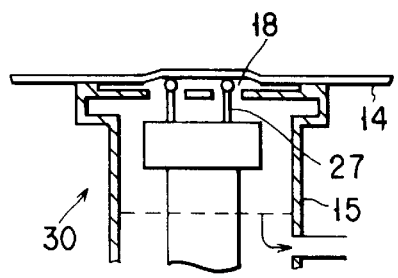

Next, the pin holder 19 having the push-up pins 27 mounted thereon is moved upwardly by the driving device 31. The push-up pins 27 pass through the through holes 18 formed in the backup holder 15 to push up the adhesive sheet 14 from the rear surface side thereof (FIG. 21C). Vacuum suction of the vacuum chamber is effected in the same manner as in the case of separating the semiconductor element 13 from the adhesive sheet 14.

Figure 21D:
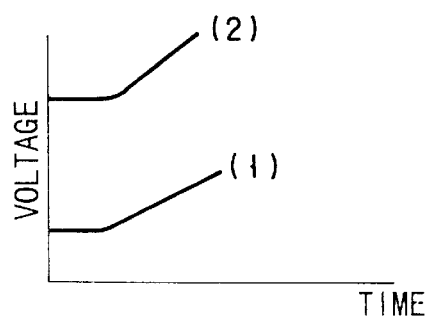

At this time, as shown in FIG. 21D, the load applied to the push-up pin 27 is increased with the upward movement of the push-up pin 27.

Further, the push-pin 27 is moved upwardly to the height required for separating the semiconductor element 13 from the adhesive sheet 14.

Figure 21E:
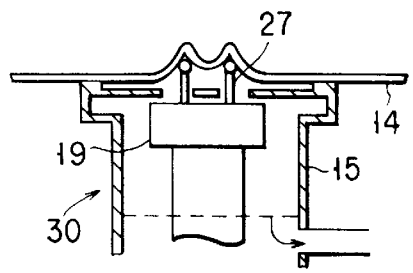
Figure 21F:
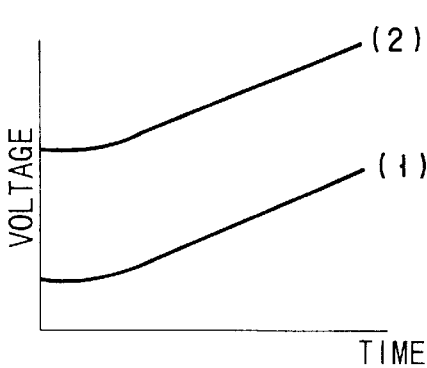

As shown in FIG. 21E, the load increases with the upward movement of the push-up pin 27 if the adhesive sheet 14 is not broken through (FIG. 21F). Therefore, the load takes a maximum value when the push-up pin 27 has reached the highest point.

Figure 21G:
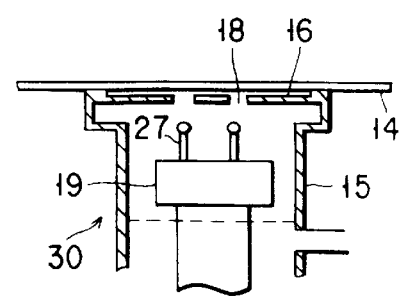
Figure 21H:
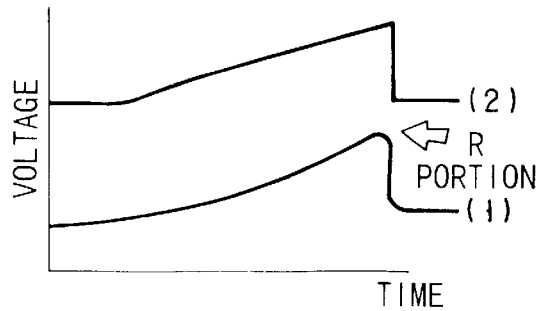

After this, as shown in FIG. 21G, if the push-up pin 27 is moved downwardly, the load applied to the push-up pin 27 indicates the maximum value (FIG. 21H) when the push-up pin 27 has reached the highest point (R portion). The determining unit 35 stores the maximum value.

The above measurement can be made by using an adhesive sheet 14 having no semiconductor elements 13 mounted thereon or using that portion of an adhesive sheet 14 having semiconductor elements 13 partly mounted thereon on which the semiconductor elements are not disposed.

After the maximum permissible load applied to the push-up pin 27 in a case where the adhesive sheet will not be broken is measured by the load measuring unit 34 and stored in the determining unit 35, the actual operation of separating the semiconductor element 13 from the adhesive sheet 14 is effected.

In this case, each time the pushing-up operation is effected, the load measuring unit 34 measures the load applied to the push-up pin 27 when the push-up pin has reached the highest point and the determining unit 35 determines whether or not the push-up pin 27 has broken the adhesive sheet 14 by comparing the measured value with the previously stored maximum value.

FIGS. 22A to 22H illustrate the operation effected when the push-up pin 27 breaks through the adhesive sheet 14 and show cross sections of the semiconductor element pushing-up device 30 on the left side of the drawing and show variations in the load applied to the push-up pin 27 on the right side of the drawing.

Like the prior art case, the adhesive sheet 14 having the semiconductor elements 13 mounted thereon is set on the backup holder 15 and vacuum suction of the vacuum chamber is started to fixedly hold the adhesive sheet 14 on the backup holder 15 (FIG. 22A). At this time, no variation occurs in the load (FIG. 22B).

Next, the driving device 31 shown in FIG. 20 drives the pin holder 19 having the push-up pins 27 mounted thereon upwardly. Then, the push-up pins 27 pass through the holes 18 of the backup holder 15 to push up the semiconductor element 13 from the rear surface side thereof via the adhesive sheet 14 (FIG. 22C).

At this time, as shown in FIG. 22D, the load applied to the push-up pin 27 increases with the upward movement of the push-up pin 27.

In this case, if the push-up pin 27 breaks through the adhesive sheet 14 (FIG. 22E), the load applied to the push-up pin 27 is lowered (FIG. 22F). The push-up pin 27 continues to move upwardly, but the load does not substantially increase.

Then, like the conventional case, the semiconductor element 13 is taken up by suction of the semiconductor element suction head 10 and the pin holder 19 is moved downwardly (FIG. 22G).

At this time, as shown in FIG. 22H, the load after the push-up pin 27 has reached the highest point (R portion) becomes smaller than the maximum value measured before the operation since the load does not substantially rise after the push-up pin 27 has broken through the adhesive sheet 14.

Figure 23:
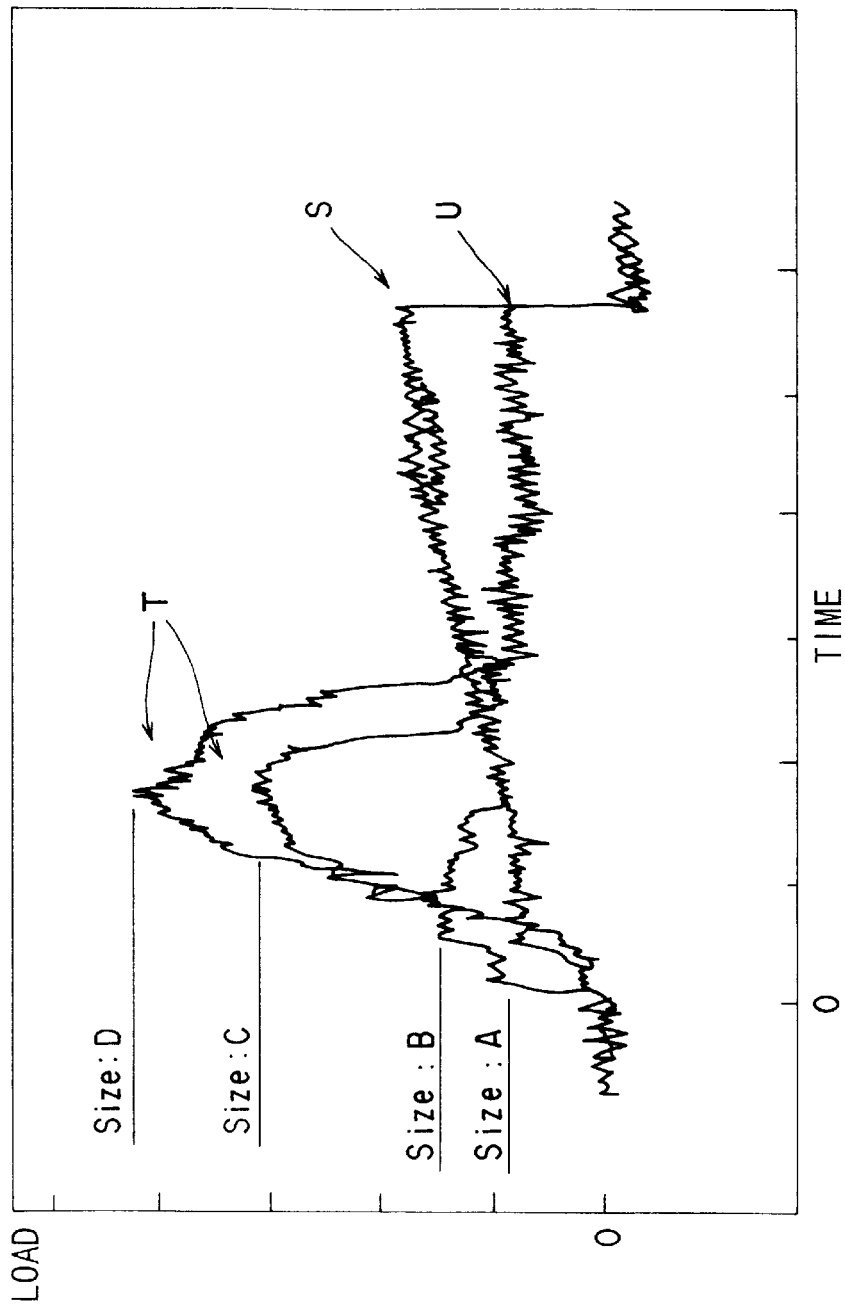
FIG. 23 is a diagram showing the actually measured values of loads which vary according to the chip size and are applied to the push-up pin 27 of the semiconductor element push-up device 30.

FIG. 23 shows the actually measured value of the load applied to the push-up pin 27.

In FIG. 23, the size A to size D indicate variations in the area of the semiconductor element 13 and the area of the semiconductor element 13 is sequentially increased in the order of A to D.

With the sizes A and B in which the area of the semiconductor element 13 is small, the load applied to the push-up pin 27 substantially monotonously increases and indicates the maximum value S larger than the load used for separating the semiconductor element 13 from the adhesive sheet 14 when the push-up pin 27 has reached the highest possible point (S portion) since the push-up pin is set in contact with the adhesive sheet 14 at this point to push up the same.

On the other hand, with the sizes C and D in which the area of the semiconductor element 13 is large, the load applied to the push-up pin 27 rapidly increases in the first stage, and is lowered after the time (T portion) when the adhesive sheet 14 is broken and is then kept substantially unchanged after a certain time point.

When the push-up pin 27 has reached the highest point (U portion), the load is set to a value smaller than the load value set when the push-up pin 27 with the size A or B in which the area of the semiconductor element 13 is small has reached the highest point (S portion).

Thus, the load measuring unit 34 measures the load applied to the push-up pin 27 and the determining unit 35 compares the load set when the push-up pin 27 has reached the highest point, that is, in the R portion shown in FIG. 22H with the maximum value of the load measured and stored when the push-up pin 27 prior to the operation is set in contact with only the adhesive sheet 14 having no semiconductor elements 13 mounted thereon and determines that the adhesive sheet is broken if the former load is smaller than the latter load and issues information of abnormal condition to the control device 32.

The control device 32 interrupts the operation of the pin holder driving device 31 and informs the operator of occurrence of the abnormal condition by issuing an alarm sound or using a monitor television.

In the above embodiment, it is determined that the adhesive sheet 14 is broken if the load applied to the push-up pin 27 when the push-up pin 27 has reached the highest point is smaller than the maximum value of the load measured before the operation, but it is possible to define a reference range of an adequate width by using the maximum value of the load measured before the operation as a reference value and determine that the adhesive sheet 14 is broken when the load does not lie in the reference range.

Further, in the above case, breakage of the adhesive sheet is determined by comparing the load applied to the push-up pin 27 when the push-up pin 27 has reached the highest point with the maximum value of the load measured before the operation, but it is also possible to make the determination by comparing waveforms created by measured values of the load.

Next, methods for controlling the pushing-up operation of the push-up pin are explained with reference to FIGS. 24 and 25.

In either method, since the load value required for separating the semiconductor element 13 from the adhesive sheet 14 is changed when the area of the semiconductor element is changed according to the change of the type of the semiconductor element, for example, a sequence of steps of the pushing-up operation are effected by using the adhesive sheet 14 having no semiconductor elements 13 mounted thereon, the load applied to the push-up pin 27 is measured and the waveform thereof is stored as new initial data.

After this, the operation of always measuring the load and continuously effecting the pushing-up operation while always comparing the measured load with the initial data as shown by the flowchart of FIG. 24 is effected.

Figure 25:
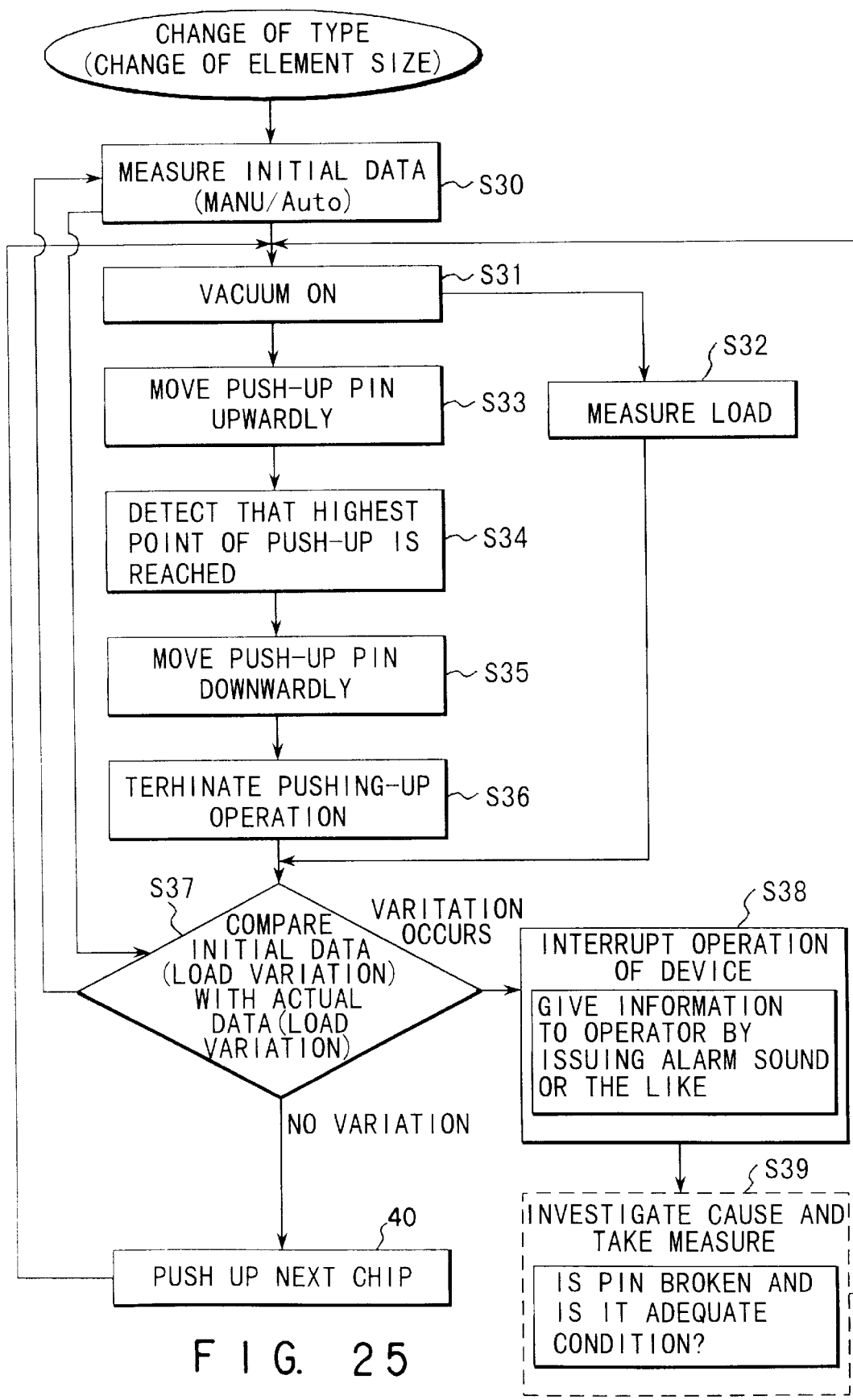
FIG. 25 is a flowchart for illustrating another method for controlling the push-up operation of the push-up pin 27.

Further, the operation of measuring the load applied to the push-up pin 27 in one pushing-up operation, storing the waveform of the measured load and comparing the measured waveform with the waveform of initial data for each semiconductor element is shown in FIG. 25.

First, the flowchart of FIG. 24 is explained.

As described before, since the load required for separating the semiconductor element 13 from the adhesive sheet 14 is changed when the area of the semiconductor element is changed according to the change of the type of the semiconductor element, for example, a sequence of steps of the pushing-up operation are effected by using the adhesive sheet 14 having no semiconductor elements 13 mounted thereon, the load applied to the push-up pin 27 is measured (S20) and the waveform thereof is stored as new initial data.

Next, vacuum suction of the adhesive sheet 14 is started (S21) and the operation of moving the push-up pin upwardly is started (S22). At this time, whether the load value has been changed or not is always determined (S24) by always measuring the load applied to the push-up pin 27 (S23) and comparing the measured load with the previously measured and stored initial data.

In this case, if the load change is detected, the control device determines that the adhesive sheet 14 may be broken and immediately interrupts the operation of the device and gives information to this effect to the operator by issuing an alarm sound or the like (S25).

The operator investigates the cause, takes an adequate measure (S26) and then starts the next semiconductor element pushing-up operation (S29).

On the other hand, if it is determined that no load change is detected, the push-up pin is further moved upwardly until it reaches the highest point, and at the same time, the load applied to the push-up pin 27 is always measured to always determine whether the load change has occurred or not.

After the push-up pin has reached the highest point of push-up (S27), the push-up pin is moved downwardly (S28) and the pushing-up operation for the next semiconductor element is effected (S29).

Next, the flowchart of FIG. 25 is explained.

In this case, unlike the case of FIG. 24 in which the load is always measured and whether the load has been changed or not is always determined, the loads measured while a sequence of steps of the pushing-up operation are effected are stored as waveforms and the waveforms are compared with the waveform of initial data when the sequence of steps of the pushing-up operation is completed so as to determine whether the load change has occurred or not. The process, other than the timing of the determining operation, is effected in the same manner as in the flowchart of FIG. 24 (S30–S36, S38–40).

In the case of FIG. 25, since it is sufficient to check occurrence of the load change by comparing the measured data with the initial data in one step (S37) for one semiconductor element, the load change determining unit is not required to have high-operation speed and can be easily realized.

On the other hand, in the case of FIG. 24, since the load is always measured and determination of the load change is always made, the operation of the device can be immediately interrupted when the load change has occurred. Therefore, damage to the semiconductor elements can be suppressed and the cause of the load change can be easily detected.

Thus, since the semiconductor element pushing-up device 30 of this invention includes a measuring unit 34 for measuring the load applied to the push-up pin 27 shown in FIG. 20, a determining unit 35 for determining breakage of the adhesive sheet 14 based on the load value obtained when the push-up pin 27 has reached the highest point and a control device 32 for interrupting the operation of the device and giving information to this effect to the operator in response to a signal from the determining unit 35, it is possible to prevent the operation from being continuously effected in a state in which the adhesive sheet 14 is broken.

Thus, it is possible to solve the problem of the conventional semiconductor element pushing-up device that the adhesive sheet 14 cannot be sufficiently drawn by vacuum suction force and fixedly held and the semiconductor element 13 cannot be separated from the adhesive sheet 14 if the operation is continuously effected after the adhesive sheet 14 is broken.

Further, it is possible to solve a problem of the conventional semiconductor element pushing-up device that a large number of defective products may be already made when breakage of the adhesive sheet 14 is detected since breakage of the adhesive sheet 14 cannot be detected until the process for a preset number (or one lot) of semiconductor elements is completed.

Next, a method for applying a voltage between the semiconductor element suction head 10 for taking up the semiconductor element 13 and the push-up pin 27 and determining that the adhesive sheet 14 is broken when current flows therebetween is explained.

Figure 26:
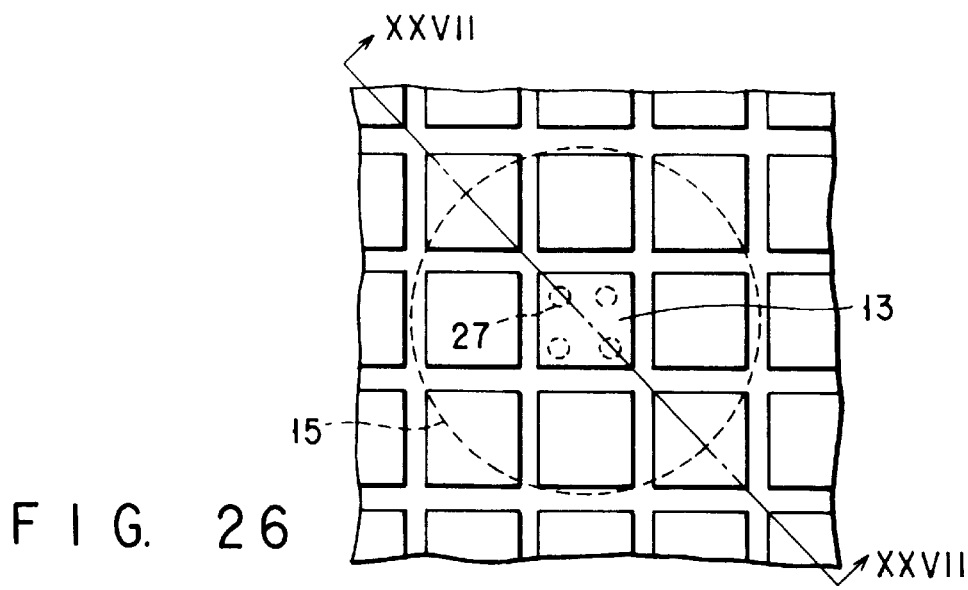
FIG. 26 is an enlarged top plan view showing a state in which a semiconductor element is placed on the upper surface of a portion of a backup holder 15.
Figure 27:
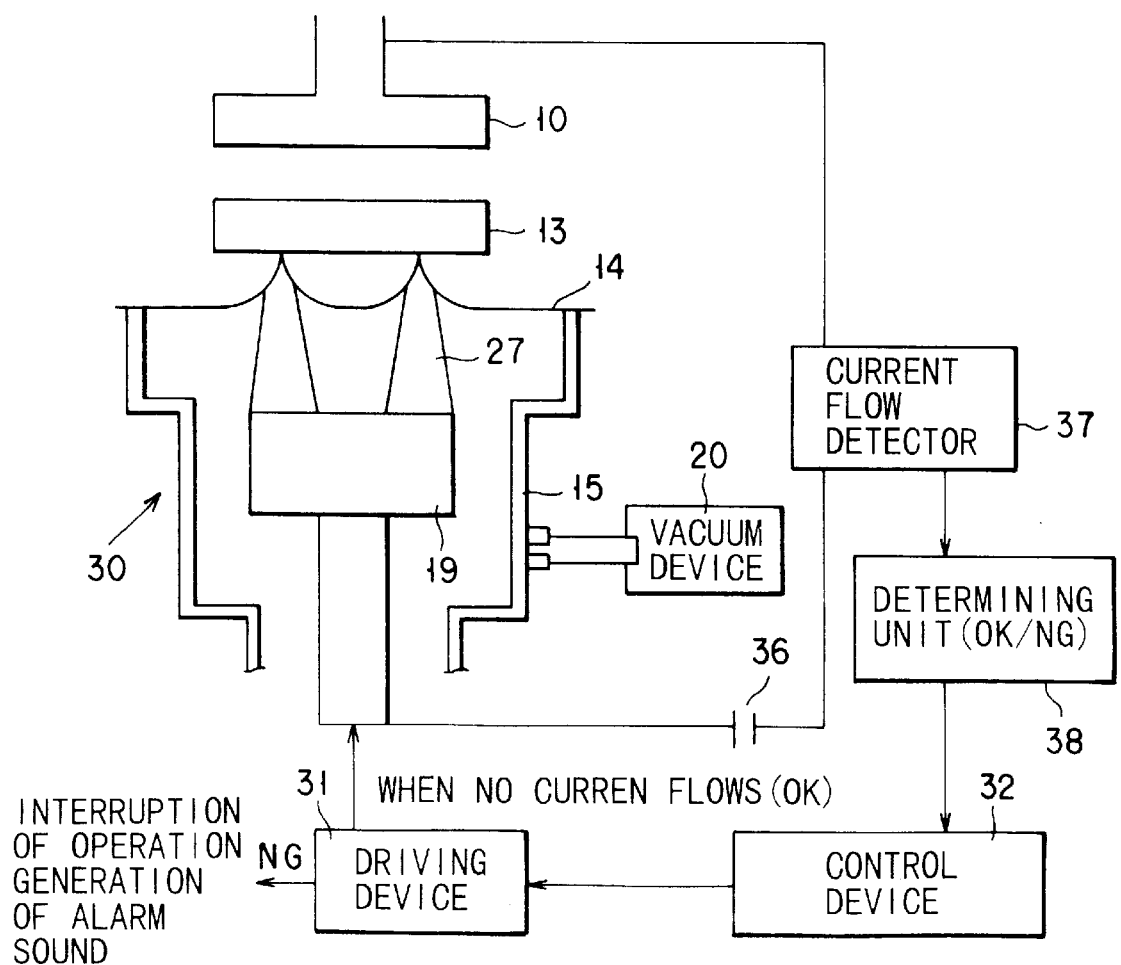
FIG. 27 shows a cross section taken along the line XXVII—XXVII of FIG. 19 and the construction of peripheral devices.

FIG. 26 is an enlarged top plan view showing the semiconductor substrate on a semiconductor element pushing-up device of this invention and FIG. 27 shows a cross section taken along the line XXVII—XXVII of FIG. 26 and the construction of peripheral devices of the semiconductor element pushing-up device.

Like the semiconductor element pushing-up device according to the embodiment shown in FIG. 6B, the semiconductor element pushing-up device 30 includes a backup holder 15, push-up pin 27, pin holder 19, pin holder driving device 31, control device 32, and vacuum device 20 whose constructions are the same as those used in the above embodiment.

It additionally includes a power supply device 36 such as a battery for applying a potential difference between the semiconductor element suction head 10 for taking up the semiconductor element 13 and the push-up pin 27, a current detector 37 for detecting current flow between the semiconductor element suction head 10 and the push-up pin 27, and a determining unit 38 for determining whether or not the adhesive sheet 14 is broken according to the detected current value.

Further, the control device 32 includes a mechanism for controlling the operation of the pin holder driving device 31 based on the result of determination by the determining unit 38. In this case, it is possible to apply a voltage via the pin holder 19 or the like without directly applying a voltage to the semiconductor element suction head 10 or push-up pin 27. For example, the semiconductor element suction head 10, push-up pin 27 and pin holder 19 are formed of a conductive material such as hard metal or SUS.

Next, a method for detecting breakage of the adhesive sheet 14 based on the passage of current is explained.

The first method is a method for detecting current flow at the same time that the semiconductor element 13 is taken up by suction of the semiconductor element suction head 10.

For example, as shown in FIG. 28, a test pat 41 is formed on the upper peripheral portion of the semiconductor element 13 and the test pat 41 is made higher than other regions such as bonding pads 43 or the semiconductor element 13 covered with a protection film 42 of polyimide, for example.

Thus, the test pat 41 is brought into contact with the semiconductor element suction head 10 when the semiconductor element 13 is taken up and the potentials of the semiconductor element 13 and the semiconductor element suction head 10 are set to the same potential level via the test pat 41.

At this time, if the adhesive sheet 14 is broken, the push-up pin 27 and the semiconductor element 13 are brought into direct contact with each other, thereby causing a current to flow from the push-up pin 27 to the semiconductor element suction head 10 via the semiconductor element 13 and test pat 41.

On the other hand, if the adhesive sheet 14 is not broken, the push-up pin 27 and the semiconductor element 13 are electrically isolated from each other by the presence of the adhesive sheet 14 and no current flows.

In the first method, the current flowing between the semiconductor element suction head 10 and the push-up pin 27 via the semiconductor element 13 and test pat 41 is detected, but in the second method, the current flowing between the semiconductor element suction head 10 and the push-up pin 27 can be directly detected without passing the current through the test pat 41.

In the second method, as shown in FIG. 29, the semiconductor element suction head 10 takes up the semiconductor element 13 and is set in indirect contact with the push-up pins 27 with only the adhesive sheet 14 disposed therebetween.

At this time, if the adhesive sheet 14 is broken, the push-up pin 27 and the semiconductor element suction device 10 are brought into direct contact with each other, thereby causing a current to flow from the push-up pin 27 to the semiconductor element suction head 10.

On the other hand, if the adhesive sheet 14 is not broken, the push-up pin 27 and the semiconductor element 13 are electrically isolated from each other by the presence of the adhesive sheet 14 and no current flows.

In the second method, it is not necessary to provide a new test pat 41 on the semiconductor element 13 and the second method can be relatively flexibly applied to any type of semiconductor element 13 in comparison with the first method.

In the first method in which a current is caused to directly flow in the semiconductor element 13, much attention must be paid to application of a voltage so as to prevent an extremely large current from flowing in the semiconductor element 13, but in the second method, since the current is detected without passing the current through the semiconductor element, it is not necessary to pay much attention to the current value and the second method can be more easily put into practice.

Further, like the second method, in a third method, the current flow between the semiconductor element suction head 10 and the push-up pin 27 is directly detected, but it is possible to additionally provide a semiconductor element suction head (not shown) exclusively used for detecting current flow so as to detect current flow by means of this device instead of detecting the current flow by use of the semiconductor element suction head 10.

In the case of the third method, in addition to the feature of the second method, it is possible to detect the current flow in a different semiconductor element 13 by use of the semiconductor element suction head exclusively used for detecting the current flow while the semiconductor element 13 is transferred to the position correction stage.

Therefore, the operation performance will not be lowered because of addition of the operation for detecting the current flow.

FIGS. 30 and 31 are flowcharts for illustrating methods for detecting breakage of the adhesive sheet 14 by detecting the current flow.

FIG. 30 is a flowchart for illustrating the first method for detecting breakage of the adhesive sheet.

Vacuum suction is started (S40) to fixedly hold the adhesive sheet 14 shown in FIG. 27 on the holder 15, and at the same time, the operation of detecting the current flow is started (S41).

The current detecting operation is effected to determine whether or not the semiconductor element suction head 10 and the push-up pin 27 are electrically connected to each other (S43) while the push-up pin 27 is moved upwardly (S42) so as to be set in indirect contact with the semiconductor element 13 with the adhesive sheet 14 disposed therebetween and then push up the semiconductor element 13.

In this case, if the current flow is detected and it is determined that the adhesive sheet 14 is broken, the operation of the device is interrupted and information to this effect is given to the operator by issuing an alarm sound or the like (S44).

The operator investigates the cause, takes an adequate measure (S45) and then starts the semiconductor element pushing-up operation again.

On the other hand, if the current flow is not detected, it is determined that the adhesive sheet 14 is not broken and the push-up pin 27 is moved upwardly until it reaches the highest point (S46).

The semiconductor element suction head 10 applies suction force to the semiconductor element 13 to take up the same from the adhesive sheet 14. Then, the push-up pin 27 is moved downwardly (S47) and the pushing-up operation for the next semiconductor element 13 is started.

FIG. 31 is a flowchart for illustrating detection of breakage by use of the second or third method.

Like the first method shown in FIG. 30, vacuum suction is started (S50) to fixedly hold the adhesive sheet 14 on the holder 15, but unlike the first method, in this example, detection of current flow is not effected.

The push-up pin 27 is started to move upwardly (S51) and moved to the highest point (S52) and the semiconductor element suction head 10 applies suction force to the semiconductor element 13 to take up the same from the adhesive sheet 14.

After the semiconductor element 13 is taken up by suction, the push-up pin 27 is moved downwardly (S53) and the semiconductor element suction head 10 transfers the semiconductor element 13 to the position correction stage while holding the same by suction (S54).

At this time, unlike the first method, the pushing-up operation for the next semiconductor element 13 is not immediately started and the semiconductor element suction head 10 which has transferred the semiconductor element 13 to the position correction stage or another semiconductor element suction head used for detecting current flow is moved downwardly (S55).

At the same time, the push-up pin 27 is moved upwardly and the operation of detecting current flow is started (S56).

Since the semiconductor element 13 is already transferred, the semiconductor element suction head 10 or another semiconductor element suction head and the push-up pin 27 are set in indirect contact with each other with the adhesive sheet 14 disposed therebetween.

At this time, if the current flow is detected and it is determined that the adhesive sheet 14 is broken (S57), the operation of the device is interrupted and information to this effect is given to the operator by issuing an alarm sound or the like (S58). The operator investigates the cause, takes an adequate measure (S59) and then starts the semiconductor element pushing-up operation again.

If the current flow is not detected, it is determined that the adhesive sheet 14 is not broken, and the xy stage is moved and the pushing-up operation for a next adjacent semiconductor element is started.

Thus, since the semiconductor element pushing-up device 30 includes a power supply device 36 for applying a voltage between the semiconductor element suction head 10 and the push-up pin 27, a measuring unit 37 for detecting current flowing between the semiconductor element suction head 10 and the push-up pin 27, a determining unit 38 for determining whether or not the adhesive sheet 14 is broken according to the detected current flow, and a control device 32 for interrupting the operation of the device and giving information to this effect to the operator in response to a signal from the determining unit 38, it is possible to prevent the operation from being continuously effected in a state in which the adhesive sheet 14 is broken. Therefore, it is possible to solve the problem of the conventional semiconductor element pushing-up device that the adhesive sheet 14 cannot be sufficiently drawn by vacuum suction force and fixedly held and the semiconductor element 13 cannot be separated from the adhesive sheet 14 if the operation is continuously effected after the adhesive sheet 14 is broken.

Further, it is possible to solve a problem of the conventional semiconductor element pushing-up device that a large number of defective products may be already made when breakage of the adhesive sheet 14 is detected since breakage of the adhesive sheet 14 cannot be detected until the process for a preset number (or one lot) of semiconductor elements is completed.

Further, since breakage of the adhesive sheet 14 can be detected by use of two or more methods based on a lowering in the pressure in the vacuum chamber, a reduction in the load value applied to the push-up pin and/or the passage of current by adequately combining the above mentioned embodiments, breakage of the adhesive sheet 14 can be detected more reliably and occurrence of defective products can be more effectively suppressed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A push-up pin unit including a plurality of push-up pins used for separating a semiconductor element attached by adhesive to an adhesive sheet of a semiconductor element pushing-up device in a die bonding apparatus from said adhesive sheet by pushing upwardly said semiconductor element from the rear surface side of said adhesive sheet, each of said push-up pins comprising:

a tip end portion having a constant radius of curvature over an angle of circumference larger than 180°, thereby applying uniform pushing-up pressure on said adhesive sheet such that expansion of said adhesive is kept constant when the pushing-up pressure for pushing upwardly said semiconductor element from the rear surface side of said adhesive sheet is applied; and a base portion for supporting said tip end portion.

2. A push-up pin according to claim 1, wherein a portion of said tip end portion which is set into contact with the rear surface of said adhesive sheet is formed in a semi-spherical shape.

3. A push-up pin according to claim 1, wherein a coupling portion is provided between said tip end portion and said base portion.

4. A semiconductor element pushing-up device in a die bonding apparatus according to claim 1, wherein a portion of said tip end portion which is set into contact with the rear surface of said adhesive sheet is formed in a spherical shape.

5. A semiconductor element pushing-up device in a die bonding apparatus comprising:
   a plurality of push-up pins each of which includes a tip end portion having a constant radius of curvature over an angle of circumference larger than 180°, thereby applying uniform push-up pressure on an adhesive sheet such that expansion of an adhesive on said adhesive sheet is kept constant when the push-up pressure for separating a semiconductor element which is attached to said adhesive sheet via said adhesive from said adhesive sheet by pushing upwardly said semiconductor element from the rear surface side of said adhesive sheet is applied, and a base portion for supporting said tip end portion;
   a pin holder for supporting said push-up pin to be movable in upward and downward directions;
   backup holder for receiving said push-up pin and said pin holder and used as a vacuum chamber having at least one through hole formed in an upper surface thereof for passage of said push-up pin;
   a vacuum device for drawing said adhesive sheet to which said semiconductor element is attached via said adhesive onto the upper surface of said backup holder to provide vacuum in said backup holder; and
   a drive control device for driving said pin holder in the upward and downward directions.

6. A semiconductor element pushing-up device in a die bonding apparatus according to claim 5, wherein a portion of said tip end portion which is set into contact with the rear surface of said adhesive sheet is formed in a semi-spherical shape.

7. A semiconductor element push-up device in a die bonding apparatus according to claim 4, wherein a coupling portion is provided between said tip end portion and said base portion.

8. A semiconductor element push-up device in a die bonding apparatus according to claim 5, wherein a portion of said tip end portion which is set into contact with the rear surface of said adhesive sheet is formed in a spherical shape.

9. A semiconductor element pushing-up device in a die bonding apparatus comprising:
   a plurality of push-up pins each of which includes a tip end portion having an angle of circumference equal to or larger than 180°, thereby applying uniform pushing-up pressure on an adhesive sheet such that expansion of an adhesive on said adhesive sheet is kept constant when the pushing-up pressure for separating a semiconductor element which is attached to said adhesive sheet via said adhesive from said adhesive sheet by pushing upwardly said semiconductor element from the rear surface side of said adhesive sheet is applied, and a base portion for supporting said tip end portion;
   a pin holder for supporting said push-up pin to be movable in upward and downward directions;
   backup holder for receiving said push-up pin and said pin holder and used as a vacuum chamber having at least one through hole formed in an upper surface thereof for passage of said push-up pin;
   a vacuum device connected to said backup holder, for drawing said adhesive sheet to which said semiconductor element is attached via said adhesive onto the upper surface of said backup holder to provide vacuum under a vacuum suction pressure in said backup holder;
   drive control means for driving said pin holder in the upward and downward directions;
   a vacuum pressure measuring unit connected to said vacuum device, for measuring the vacuum suction pressure; and
   control means for controlling the operation of said push-up pin based on the result of measurement of said vacuum pressure measuring unit.

10. A semiconductor element pushing-up device in a die bonding apparatus according to claim 9, wherein said control means for controlling the operation of said push-up pin has a function of comparing a measured value of said vaccum pressure measuring unit with a previously set value, and a function of starting the operation of said push-up in when the measured value is larger than the previously set value.

11. A semiconductor element pushing-up device in a die bonding apparatus according to claim 9, wherein said control means for controlling the operation of said push-up pin has a function of detecting a lowering in the measured value of said vaccum pressure measuring unit and a function of interrupting the operation of said push-up pin when a lowering in the measured value is detected.

12. A semiconductor element pushing-up device in a die bonding apparatus comprising:
   a plurality of push-up pins each of which includes a tip end portion having an angle of circumference equal to or larger than 180°, thereby applying uniform pushing-up pressure on an adhesive sheet such that expansion of an adhesive on said adhesive sheet is kept constant when the pushing-up pressure for separating a semi-conductor element which is attached to said adhesive sheet via said adhesive from said adhesive sheet by pushing upwardly said semiconductor element from the rear surface side of said adhesive sheet is applied, and a base portion for supporting said tip end portion;
   a pin holder for supporting said push-up pin to be movable in upward and downward directions;
   a backup holder for receiving said push-up pin and said pin holder and used as a vacuum chamber having at least one through hole formed in an upper surface thereof for passage of said push-up pin;
   a vacuum device connected to said backup holder, for drawing said adhesive sheet to which said semiconductor element is attached via said adhesive onto the upper surface of said backup holder to provide vacuum in said backup holder;
   means connected to said pin holder, for measuring a load applied to said pushup pin; and
   control means for controlling the operation of said push-up based on the result of measurement of said load measuring means.

13. A semiconductor element pushing-up device in a die bonding apparatus according to claim 12, wherein said control means for controlling the operation of said push-up pin has a function of comparing a measured load of said load measuring means with a previously set valve and interrupting the operation of said push-up pin when a lowering in the measured load valve is detected.

14. A semiconductor element pushing-up device in a die bonding apparatus comprising:
   a plurality of push-up pins each of which includes a tip end portion having an angle of circumference equal to or larger than 180°, thereby applying uniform pushing-up pressure on an adhesive sheet such that expansion of an adhesive on said adhesive sheet is kept constant when the pushing-up pressure for separating a semiconductor element which is attached to said adhesive sheet via said adhesive from said adhesive sheet by pushing upwardly said semiconductor element from the rear surface side of said adhesive sheet is applied and said semiconductor element is taken up by suction of a semiconductor element suction head, and a base portion for supporting said tip end portion;

a pin holder for supporting said push-up pin to be movable in upward and downward directions;

a backup holder for receiving said push-up pin and said pin holder and used as a vacuum chamber having at least one through hole formed in an upper surface thereof for passage of said push-up pin;

a vacuum device connected to said backup holder, for drawing said adhesive sheet to which said semiconductor element is attached via said adhesive onto the upper surface of said backup holder to provide vacuum in said backup holder;

means for applying a voltage between said semiconductor element suction head and said push-up pin;

means for measuring a current flowing between said semiconductor element suction head and said push-up pin; and control means for controlling the operating condition of said push-up pin based on a result of measurement of said current measuring means.

* * * * *